United States Patent
Agarwal et al.

(10) Patent No.: US 12,373,287 B2
(45) Date of Patent: Jul. 29, 2025

(54) DISTRIBUTION OF ERROR CHECKING AND CORRECTION (ECC) BITS TO ALLOCATE ECC BITS FOR METADATA

(71) Applicant: Intel Corporation, Santa Clara, CA (US)

(72) Inventors: Rajat Agarwal, Portland, OR (US); Wei P. Chen, Portland, OR (US); Bill Nale, Livermore, CA (US); James A. McCall, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1042 days.

(21) Appl. No.: 17/156,399

(22) Filed: Jan. 22, 2021

(65) Prior Publication Data

US 2021/0141692 A1 May 13, 2021

(51) Int. Cl.
*G06F 11/00* (2006.01)
*G06F 11/10* (2006.01)

(52) U.S. Cl.
CPC .................. *G06F 11/1068* (2013.01)

(58) Field of Classification Search
None
See application file for complete search history.

(56) References Cited

U.S. PATENT DOCUMENTS

| | | | | |
|---|---|---|---|---|
| 9,448,883 | B1* | 9/2016 | Shrader | G06F 11/1072 |
| 9,766,976 | B2* | 9/2017 | d'Abreu | H03M 13/2942 |
| 10,079,612 | B1* | 9/2018 | Li | G06F 11/1076 |
| 11,210,167 | B2* | 12/2021 | Bains | G06F 11/1068 |
| 2012/0182821 | A1* | 7/2012 | Perego | G06F 11/1048 |
| | | | | 365/230.01 |
| 2013/0235957 | A1* | 9/2013 | El Khamy | H04L 1/0036 |
| | | | | 375/340 |
| 2016/0092306 | A1 | 3/2016 | Benedict et al. | |
| 2018/0143873 | A1* | 5/2018 | Ware | G11C 29/42 |
| 2018/0356998 | A1* | 12/2018 | Wu | G06F 12/0246 |
| 2019/0034270 | A1 | 1/2019 | Byun et al. | |
| 2019/0138230 | A1* | 5/2019 | Lim | G11C 29/42 |
| 2019/0171520 | A1* | 6/2019 | Cadigan | G11C 29/52 |
| 2019/0205225 | A1* | 7/2019 | Kim | G06F 13/4239 |
| 2019/0206477 | A1* | 7/2019 | Kim | G11C 29/808 |
| 2019/0243709 | A1 | 8/2019 | Meaney et al. | |
| 2020/0075079 | A1* | 3/2020 | Kim | G11C 11/4093 |
| 2020/0133769 | A1* | 4/2020 | Bains | G06F 11/1048 |
| 2021/0141692 | A1* | 5/2021 | Agarwal | H03M 13/19 |
| 2021/0373995 | A1* | 12/2021 | Shin | G06F 11/1048 |

OTHER PUBLICATIONS

Extended European Search Report for Patent Application No. 21198643.5, Mailed Mar. 17, 2022, 8 pages.

* cited by examiner

*Primary Examiner* — Mujtaba M Chaudry
(74) *Attorney, Agent, or Firm* — Compass IP Law PC

(57) ABSTRACT

A memory subsystem includes multiple memory resources connected in parallel, including a first memory resource and a second memory resource. The memory subsystem can split a portion of data into multiple sub-portions. Split into smaller portions, the system needs fewer ECC (error checking and correction) bits to provide the same level of ECC protection. The portion of data can include N ECC bits for error correction, and the sub-portions can each include a sub-portion of (N–M) ECC bits for error correction. The system can then use M bits of data for non-ECC purposes, such as metadata.

20 Claims, 11 Drawing Sheets

DISTRIBUTION OF ERROR CHECKING AND CORRECTION (ECC) BITS TO ALLOCATE ECC BITS FOR METADATA

FIELD

Descriptions are generally related to memory systems, and more particular descriptions are related to system management of data storage and error correction bits.

BACKGROUND

Increasing memory device density and operating speeds, coupled with smaller feature size for memory device manufacturing processes, have tended to cause increases in runtime errors for memory devices. Memory systems employ error checking and correction (ECC) to correct errors that could otherwise cause system faults. DRAM (dynamic random access memory) devices are frequently used in modules such as DIMMs (dual inline memory modules), which include multiple DRAM devices connected in parallel. Memory systems that use DIMMs often have an expectation of providing single device data correction (SDDC), where the failure of an entire DRAM device of the DIMM can be corrected.

Upcoming memory device standards are projected to have an increased internal prefetch and longer burst lengths, to result in more data bandwidth per memory device access transaction (e.g., read or write). With more bits per transaction, traditional architectures use all available ECC bandwidth for ECC. With all extra bits used for ECC, a system has no bits available for system-level purposes other than ECC.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
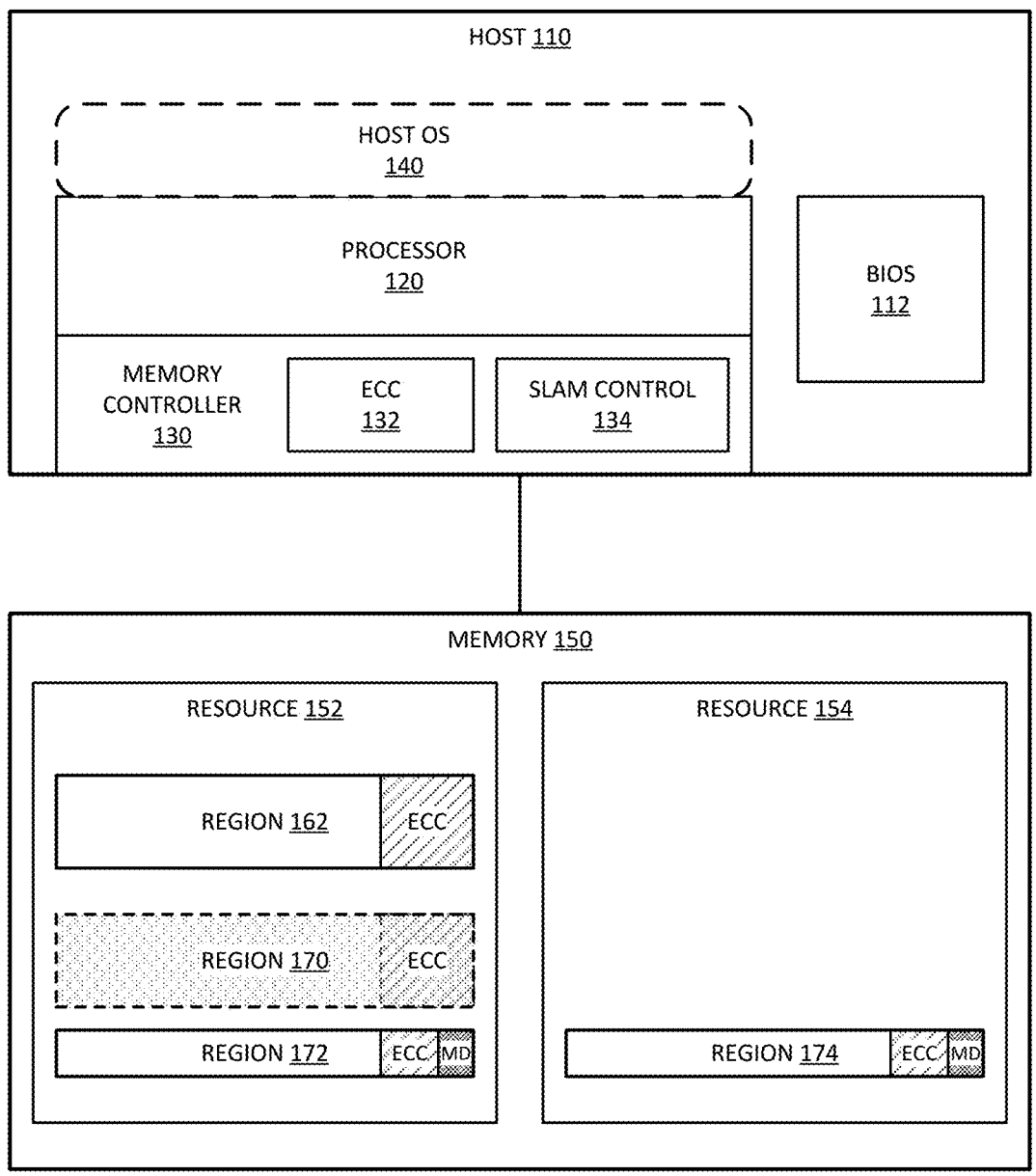
FIG. 1 is a block diagram of an example of a system with split line access control.

Descriptions of certain details and implementations follow, including non-limiting descriptions of the figures, which may depict some or all examples, and well as other potential implementations.

DETAILED DESCRIPTION

As described herein, a memory subsystem includes multiple memory resources connected in parallel, including a first memory resource and a second memory resource. The memory subsystem can split a portion of data into multiple sub-portions. Split into smaller portions, the system needs fewer ECC (error checking and correction) bits to provide the same level of ECC protection. Splitting the data into sub-portions to store in parallel memory resources can be referred to as split line access. The portion of data can include N ECC bits for error correction, and the sub-portions can each include a sub-portion of (N-M) ECC bits for error correction. The system can then use M bits of data for non-ECC purposes, such as metadata.

DRAM (dynamic random access memory) devices that are compatible with an upcoming double data rate version 5 (DDR5) standard from JEDEC (Joint Electron Device Engineering Council, now the JEDEC Solid State Technology Association) can have 4 data bus signal line interfaces (DQ[0:3]). Such a device can be referred to as a x4 device, referring to the 4 DQ (data) signal line interfaces. A DIMM (dual inline memory module) or other memory module includes multiple memory devices, such as DRAM devices, connected in parallel to process access commands. The parallel memory devices typically share a command bus and have individual data bus interfaces.

A DIMM can be identified by the number of memory devices and the device type which are populated on the board (e.g., printed circuit board (PCB)) that makes up the module. An example includes a 10×4 DIMM, referring to a DIMM with ten (10) parallel devices which each have a x4 interface. Thus, the data bus will have 40 signal lines. A 10×4 DIMM typically includes 8 memory devices for user data or the data that directly controls device execution and operation, and 2 memory devices for system data such as ECC data and metadata.

DDR5 x4 DRAM devices each provide 64 bits of data per access transaction (e.g., read or write), with 4 bits exchanged per unit interval (UI) over a 16 UI burst or burst length 16 (BL16). For a DDR5 10×4 DIMM, 8 data devices will provide 512 bits (8*64) and 2 ECC devices (which can also be referred to as redundant devices) provide 128 bits (2*64). To provide SDDC (single device data correction), which will allow complete correction for a x4 DDR5 device failure, 128 bits of ECC are required to recover the loss of the 64 bits. With only two redundant devices, all non-data bits or all ECC bandwidth for a 10×4 DIMM would be used, leaving no system bits for metadata usage.

One solution to freeing up memory storage space for a system would be to simply use fewer ECC bits. The risk of full device failure is small, meaning the increase in system feature capability from metadata could be considered a reasonable tradeoff for the rare case of transient multibit error within a device that would render the error uncorrectable. For some system architectures, the RAS (reliability, accessibility, and serviceability) requirements make such a solution unacceptable.

Another solution that would retain the full ECC capability and provide additional metadata bits would be to store additional bits in sequestered memory regions. Sequestered memory reserves space or capacity in the data devices for system bits, such as metadata bits or ECC bits. The system can used sequestered regions for ECC bits or for metadata bits.

Sequestered memory reserves capacity at the cost of a performance penalty. With sequestered memory for ECC, 64 bits of ECC can be stored in one redundant device on the DIMM (enough to detect errors for SDDC, but not to correct them), 64 bits of ECC can be spread across the data devices in a sequestered memory space or sequestered region, making 64 bits available in the other redundant device for metadata. Error detection can be accomplished with the 64 bits from the ECC device, and in response to detection of an error, the system can retrieve the sequestered data to perform error correction. Thus, each read request results in one read if no error is detected, and two reads in the rare case that an error is detected. However, a write request results in a write of data, and a read-modified-write (RMW) of the sequestered ECC data, resulting in a read in two writes.

In addition to the performance penalty, sequestered memory can result in a capacity penalty. Up to approximately ⅛ of the memory capacity can be used in sequestered memory for metadata, by essentially sequestering an additional redundant device worth of data spread across the eight data devices. Sequestering less memory could be possible, but will still result in the penalty, even if the capacity penalty is reduced.

The split line access described can be referred to as "split line access for metadata" (SLAM) when the split line access frees memory capacity for use as system metadata. Metadata usages can include Trusted Domain Extension (TDX), in-memory directory, two level memory (2LM) features, or other metadata uses. The metadata uses refer to non-ECC system uses of data capacity that is not user data.

In one example, split line access can be performed over multiple parallel memory resources. The descriptions herein generally describe the use of two parallel memory resources, essentially splitting the line access by half across two resources. Split line access can reduce the number of ECC bits needed for SDDC by reducing the number of bits provided by a single device. For example, by splitting cacheline across two different ranks, the number of devices used to store the cacheline is doubled, reducing the number of bits per memory device by half.

For the DDR5 example above, a 2-rank x4 DIMM can have 32 bits per DRAM. Thus, for SDDC, the system only needs to correct 32 bits, which can reduce the number of ECC bits needed by half. With 64 bits of ECC needed per cacheline, there will be 64 bits remaining for use as metadata bits.

Thus, if the number of bits needed for SDDC for the normal portion of data is N, the number of bits needed for SDDC for the half portion or sub-portion of data can be (N−M)/2, where M is a number representing the reduced bit requirement for the same level of ECC when the data is spread over more memory devices.

FIG. 1 is a block diagram of an example of a system with split line access control. System 100 illustrates memory coupled to a host. Host 110 represents a host computing system. Host 110 includes host hardware such as processor 120 and memory controller 130. The host hardware also includes hardware interconnects and driver/receiver hardware to provide the interconnection between host 110 and memory 150. Memory 150 includes parallel memory resources, resource 152 and resource 154, coupled to host 110. Memory controller 130 controls access to memory 150.

The host hardware supports the execution of host software on host 110. The host software can include host OS (operating system) 140. Host OS 140 represents a software platform under which other software will execute. Host OS 140 provides control to enable interfacing with hardware interconnections to couple to memory devices 160.

Memory 150 represents a hardware platform that connects one or more memory devices to host 110. For example, memory 150 can be or include a DIMM (dual inline memory module) or multiple DIMMs, which can each include multiple memory devices. Memory 150 can provide routing and control logic to control the signaling between host 110 and the memory devices hardware.

During execution, host OS 140 provides requests to access memory. The requests can be directly from host OS software can be requests through APIs (application programming interfaces) or other mechanisms for a program executing under host OS 140 to request a memory access. In response to a host memory access request, memory controller 130 maps host-based addressing for memory resources to physical address locations of memory 150.

In one example, memory controller 130 includes ECC 132, which represents error logic in host 110 to detect and correct errors in data read from memory 150. ECC 132 can generate check bits for write data to send to memory 150. ECC 132 can then decode the incoming data and ECC bits from the memory devices to determine if the data includes errors. For correctable errors (CE), ECC 132 can correct the error in the data before returning it to the requesting agent, whether host OS 140 or an application executing under host OS 140.

SLAM control 134 represents logic in memory controller 130 to provide split line access to one or more lines of memory in parallel memory resources. In one example, SLAM control 134 enables the dynamic application of split line access to selected regions of memory 150.

Memory 150 includes resource 152 in parallel with resource 154. In one example, resource 152 and resource 154 represent different ranks of memory. In one example, the different ranks can be part of a multi-rank DIMM. For example, a 2-rank DIMM can be implemented with DRAM devices that support one DRAM to be accessed as two different portions. As another example, a memory module can include multi-DRAM packages to support different ranks. In one example, resource 152 and resource 154 represent different DIMMs. In one example, resource 152 and resource 154 represent another partitioning of memory, such as by devices or banks in which split line access can provide a reduction in needed ECC bits. Resource 152 can be referred to as a first memory resource and resource 154 can be referred to as a second memory resource, but the designations can be reversed.

Resource 152 is illustrated as having region 162, which can represent a region or line of memory. For example, region 162 can represent a wordline or cacheline. In one example, region 162 represents a division of memory that is different from a wordline. Region 162 includes ECC bits to provide error correction for the bits of region 162.

In one example, system 100 supports the selective use of split line access. Thus, regions of memory to be accessed with split line access can be selected by region, and the entire resource is not necessarily subject to split line access. In one example, resource 152 includes region 162 that is not accessed with split line access, as well as region 172 that is accessed with split line access. Region 172 would be paired with region 174 of resource 154 for split line access.

With split line access, memory controller 130 stores only a sub-portion of the bits of a line in parallel resources. System 100 represents only two parallel resources, resource 152 and resource 154. System 100 can include more than two parallel resources. In one example, system 100 can split a line more than two ways. The logistics of splitting a line more than two ways may introduce complexity into the system. Regardless of added complexity, the splitting of lines to spread ECC coverage can be accomplished in similar ways to what is described herein.

The examples herein will focus primarily on splitting a line across two parallel resources. In one example, there can be more than two parallel resources, and the system can select from among the multiple available resources to choose splitting pairs.

In one example, region 172 includes ECC and metadata (MD). Likewise, region 174 includes ECC and metadata. The combined user data of region 172 and region 174 can equal the amount of user data of region 162, but the amount of combined ECC for region 172 and region 174 is lower than the ECC for region 162. The saving of ECC can enable system 100 to provide the metadata illustrated in region 172 and region 174. The total combination of ECC and metadata for region 172 and region 174 will equal the amount of ECC in region 162 when the portion is split across two resources.

BIOS (basic input/output system) 112 represents boot control for system 100. BIOS 112 controls system 100 when system 100 is initially powered up. Processor 120 can be configured to start execution of BIOS 112, which can then direct the processor to load instructions that will launch host OS 140. BIOS 112 can include configuration for host 110, such as hardware initialization, configuration settings, information about how much memory is available, and other information. In one example, memory controller 130 and BIOS 112 can exchange information related to regions in memory 150 that will be accessed with split line access.

SLAM control 134 of memory controller 130 can represent control logic to provide split line access. The control logic can include logic executed on the hardware resources of memory controller 130. Memory controller 130 is or includes a processor or processing hardware to execute the logic to manage access to memory 150.

In one example, SLAM control 134 determines to split access to region 170, which represents a region that can be the same as region 162. Instead of storing region 170 completely in resource 152, region 170 is illustrated as being grayed out. Region 170 can be replaced by split sub-regions spread over resource 152 and resource 152. Region 172 represents one sub-region and region 174 represents the other sub-region. Region 170 would require N check bits for ECC, whereas region 172 and region 174 would each require some smaller number of check bits or ECC bits, which can be represented as N-M bits. Each region can thus store (N−M)/2 ECC bits and M/2 metadata bits, for a total of M metadata bits for region 170. In one example, M is equal to ½ N, but can be a different fraction of N.

Figure 2:
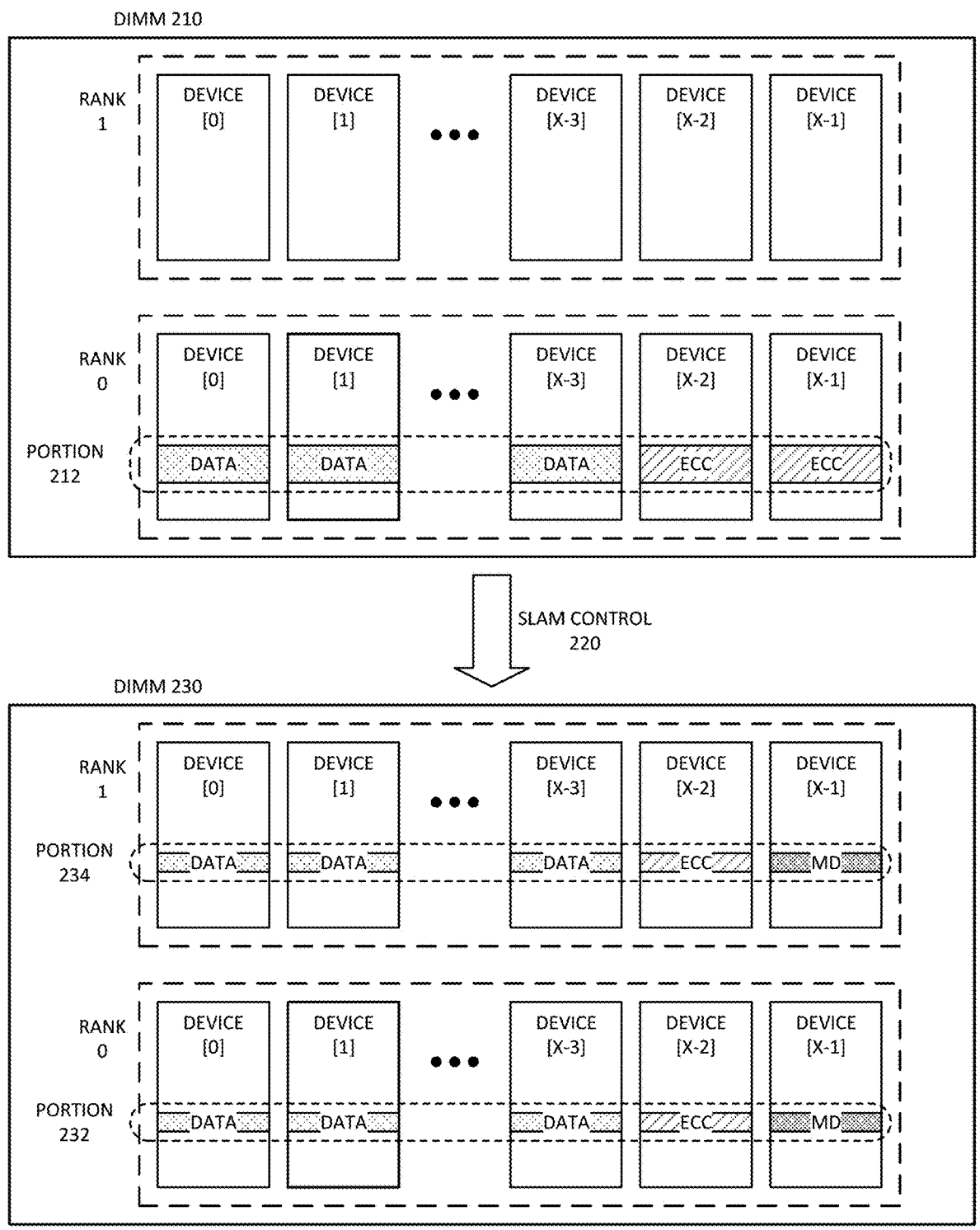
FIG. 2 is a block diagram of an example of a system in which split line access allows selectively freeing ECC capacity for metadata.

FIG. 2 is a block diagram of an example of a system in which split line access allows selectively freeing ECC bandwidth for metadata. DIMM 210 represents a DIMM that does not apply split line access. DIMM 230 represents a DIMM that implements split line access. DIMM 230 can be controlled with SLAM control 220 to enable the splitting of a line across different ranks of the DIMM. DIMM 230 can be an example of memory 150 of system 100.

DIMM 210 represents Rank 0 and Rank 1, where a rank includes X devices (Device[0:(X−1)]) connected in parallel. In general, a rank of memory refers to memory devices that share a enable signal that causes the devices to respond in parallel to a memory access command. Despite sharing a enable or trigger signal, devices in a rank can be accessed with per-device accessibility (PDA) operations that selects an individual device, such as for configuration.

Rank 0 of DIMM 210 is illustrated as having portion 212, which can be, for example, a wordline stored in Device[0:(X−1)] of Rank 0. In one example, DIMM 210 includes two redundant devices per rank, with portion 212 having user data in Device[0:(X−3)] and ECC in Device[(X−2):(X−1)]. For purposes of portion 212, no data of portion 212 is stored in Rank 1.

In one example, SLAM control 220 causes DIMM 230 to store a full portion of data as two sub-portions spread over Rank 0 and Rank 1. In DIMM 230, portion 232 represents half of a full portion like portion 212 of DIMM 210. Portion 234 represents the other half of the portion. Thus, between portion 232 and portion 234 there is a full portion of data. In one example, based on the architecture of DIMM 230, splitting the portion across Rank 0 and Rank 1 means that the same ECC protection can be provided with fewer ECC bits. Thus, portion 232 includes metadata (MD) bits in Device[X−1] and portion 234 includes metadata (MD) bits in Device [X−1]. The ECC bits of Device[X−2] in portion 232 and Device[X−2] in portion 234 are sufficient for the same level of ECC protection as the ECC bits of Device [(X−2):(X−1)] of DIMM 210.

In one example, SLAM control 220 can explicitly configure different memory regions to enable or disable split line access, and thus apply split line access only as needed in the system. Split level access can thus restrict the performance impact to regions where full device error correction, security, and other features (such as 2LM) are implemented.

Consider an example of DIMM 230 ranks of DDR DRAM devices. SLAM control 220 can provide 100% SDDC while providing full feature support for server CPUs that require metadata. The impact performance of a split line access implementation or design can be restricted to regions using metadata. By reducing the number of bits needed for ECC, split line access can simply replace ECC bits with metadata bits or replace ECC bandwidth with metadata bandwidth. Thus, split line access can reduce or eliminate the extra memory capacity required for sequestered memory.

Split level access can operate on the principle that if a cacheline read fetches less data from each memory device, the number of ECC bits required to correct a device failure will be reduced. In DDR5, each read traditionally fetches 64b of data from each x4 DRAM device, with 8 DRAMs used to access a full 512b cacheline. In DDR5 with split line access, in one example, the access is split over twice as many DRAMs, with 16 DRAMs being accessed for the full 512b of data, with each DRAM device providing only 32b of data. In the case of a DRAM device failure, only 32b would need to be corrected. To correct 32b, 64b of ECC is required instead of 128b of ECC to correct a 64b failure.

Thus, the system can selectively free up 64b for use as metadata instead of using the bits for ECC.

It will be understood that splitting data over two different ranks can have a performance impact due to "rank switching" overhead on the DDR bus. The option to selectively treat a region of memory with split line access allows the system to select options for performance, security, and system features. Performance can be selected by not splitting the data among parallel resources, but may require having lower error correction capability (lower data security) to enable the use of additional system features. The system can select data security by ensuring error correction, which could come at a cost of system features by using all available bits for ECC, or at a cost of security by using data sequestering to enable full ECC and system features. System features can be selected at the cost of performance through the use of either sequestering or split line access, or at the cost of data security by replacing ECC bits with metadata bits.

In one example, a system CPU (central processing unit) or host (typically through the memory controller) can support split line access by memory region. In one example, a memory region can be dynamically enabled for split line access at runtime based on application needs. In one example, the OS (operating system) dynamically allocates unused memory pages at runtime to a SLAM region and initiates a SLAM transition with assistance from platform firmware. In one example, selection of a memory region for split line access will result in the need to perform a data copy (to split the data between parallel memory resources) and a remapping of ECC. In one example, the platform firmware can invoke a hardware flow to perform data copy and ECC remapping for the region moving to split line access. In one example, the hardware flow can leverage an existing CPU feature, and thus provide split level access based on features already supported in existing server CPU systems.

One feature of server CPU systems that can be mentioned is ADDDC (adaptive double data device correction), referring to an architecture of data sharing among parallel memory resources to address a device failure condition. Split line access as described herein can be considered to have a similar architecture to ADDDC, and can potentially reuse capabilities in a system that supports ADDDC to implement the split line access described. It will be understood that ADDDC is an error management response to detection of an error condition, whereas split line access is not implemented in response to an error detection, but can be selectively activated to enable system features.

ADDDC and split line access can be based on a concept of lockstep data distribution or lockstep configuration or lockstep partnering. Lockstepping traditionally refers to distributing error correction data over multiple memory resources to compensate for a hard failure in one memory resource that prevents deterministic data access to the failed memory resource within the sharing. Lockstepping enables the compensation for hard failure because the distribution of the data result in a lower ECC requirement for error correction. Lockstepping for split line access can refer to distributing data over multiple memory resources to reduce the ECC requirement to free up bits for use for other purposes, whereas ADDDC distributes the data because with the hard failure the bits are no longer available.

Figure 3:
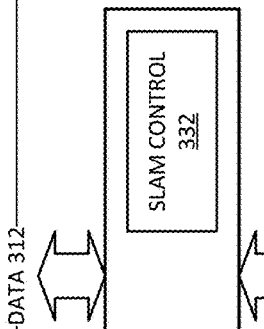
FIG. 3 is a block diagram of an example of a system with split line access applying burst chop.

FIG. 3 is a block diagram of an example of a system with split line access applying burst chop. System 300 represents a system in accordance with an example of system 100. System 300 illustrates an example of a data output pattern from parallel ranks in accordance with any example of split line access described.

Rank 310 represents memory devices in a rank, such as devices on a memory module, where the rank includes 10 devices, labeled Device[0:9]. The devices are illustrated as x4 devices, which refers to the number of signal lines of the interface with a data (DQ) bus. A x4 device has four signal lines that output data over a burst length of 16 in system 300. System 300 represents a burst chop implementation where only 8 cycles of the BL16 are needed to exchange the data.

As illustrated, system 300 operates with BL16 or a burst length of 16 unit intervals. Each device can transmit (for a read operation) or receive (for a write operation) 4 bits per unit interval, totaling 64 bits per device per operation or transaction (either read or write). System 300 specifically illustrates a read transaction, with the arrows of the devices representing the signal line output and the burst order in sequence order from the devices to controller 330.

Regardless of the orientation of the bits and the burst order, in general, in one example, during the first cycle (Burst cycle 0), data bits D[0:3] are transmitted on the data bus, represented by data 312. For the second cycle (Burst cycle 1), data bits D[4:7] are transmitted, and so forth until data bits D[28:31] for Burst cycle 7. Typically, the devices of rank 310 would continue to provide data until sending data bits D[60:63] for Burst cycle 15. With burst chop, no data is exchanged during the chopped burst cycles, BL[8:15].

Rank 320 also represents memory devices in a rank, such as devices on a memory module, where the rank includes 10 devices, labeled Device[0:9]. The devices are illustrated as x4 devices, with BL16, where rank 320 implements burst chop with data 322. Similar to data 312 of rank 310, for data 322 of rank 320, during the first cycle (Burst cycle 0), the first four bits of data are transmitted on the data bus, followed by the next four bits, and so forth until all bits have been transferred.

Instead of representing the data 322 as data bits D[0:3] for Burst cycle 0, data bits D[4:7] for Burst cycle 1, and so forth, data 322 can be considered the second part of data 312. Thus, for Burst cycle 0, data 322 illustrates data bits D[32:35], during Burst cycle 1 the devices transfer data bits D[36:39], and so forth, until data bits D[60:63] for Burst cycle 7. With burst chop, no data is exchanged during the chopped burst cycles, BL[8:15].

It will be understood that any order of data can be used. The order of bits to and from rank 310 and to and from rank 320 can be reversed based on whether the data is sent from controller 330 to the memory devices, or from the memory device to controller 330. For different amounts of data in different systems, different burst lengths, different burst order, different data bus interfaces (e.g., x8 or x16) can be used. The principle of the transaction will remain the same for the data devices of rank 310 and controller 330 exchange data 312 on a data bus, and for the data devices of rank 320 and controller 330 exchange data 322 on a data bus.

System 300 illustrates the access of two one-half cachelines per rank with burst chop. In one example, memory controller performs memory access of one half portion of data from rank 310 or other memory resource, and another half portion of data from rank 320 or other parallel memory resource.

The burst chop mode is inefficient for memory access, resulting in some bandwidth loss. To limit the bandwidth loss, the application of split line access can be limited to regions of memory that need metadata. In one example, SLAM allows dynamic selection of memory regions which can be accessed in SLAM mode or split line access mode (where a cacheline is accessed from two ranks or other parallel memory resources) or normal mode (where a cacheline is accessed from a single rank or single memory resource). In one example, the system can apply optimized rank turnaround to allow faster turnaround for burst chop mode. The faster turnaround can reduce the performance impact of burst chop mode.

System 300 represents an example of a 10×4 module configuration, referring to 10 memory devices with x4 DQ interfaces. In such a configuration, typically Device[0:7] will be "data" devices and Device[8:9] are "ECC" devices. A data device refers to the actual user data for the read or write transaction. An ECC device refers to a device that stores check bits or parity bits for decoding ECC for the data bits. In one example, the 64 bits of data from each device represents a cacheline or wordline or a portion of a cacheline (e.g., 64 bits of a 512-bit cacheline). Thus, the entire set of bits for each device represents the bits of a single line or portion of a line.

System 300 illustrates the different types of data as D0, D1, D2, . . . , for user data in Device[0:7]; P0, P1, P2, . . . , as ECC bits or parity bits; and, M0, M1, M2, . . . , for metadata bits. In system 300, in one example, the data bits of Device[8] for rank 310 include ECC bits P[0:31] and the data bits of Device[8] for rank 320 include ECC bits P[32:63]. In one example, the data bits of Device [9] for rank 310 include metadata bits M[0:31] and the data bits of Device[9] for rank 320 include metadata bits M[32: 63].

System 300 includes SLAM control 332 in controller 330 to represent the ability of system 300 to provide selective split line access. Based on SLAM control 332, controller 330 can make access requests for certain data to only one rank (either rank 310 or rank 320) and requests for other data to both ranks (both rank 310 and rank 320). When making certain data requests, controller 330 will know that the half of the data will come from each rank with burst chop. Controller 330 will schedule operations in accordance with which data is being accessed, whether split level access data or normal data.

Figure 4:
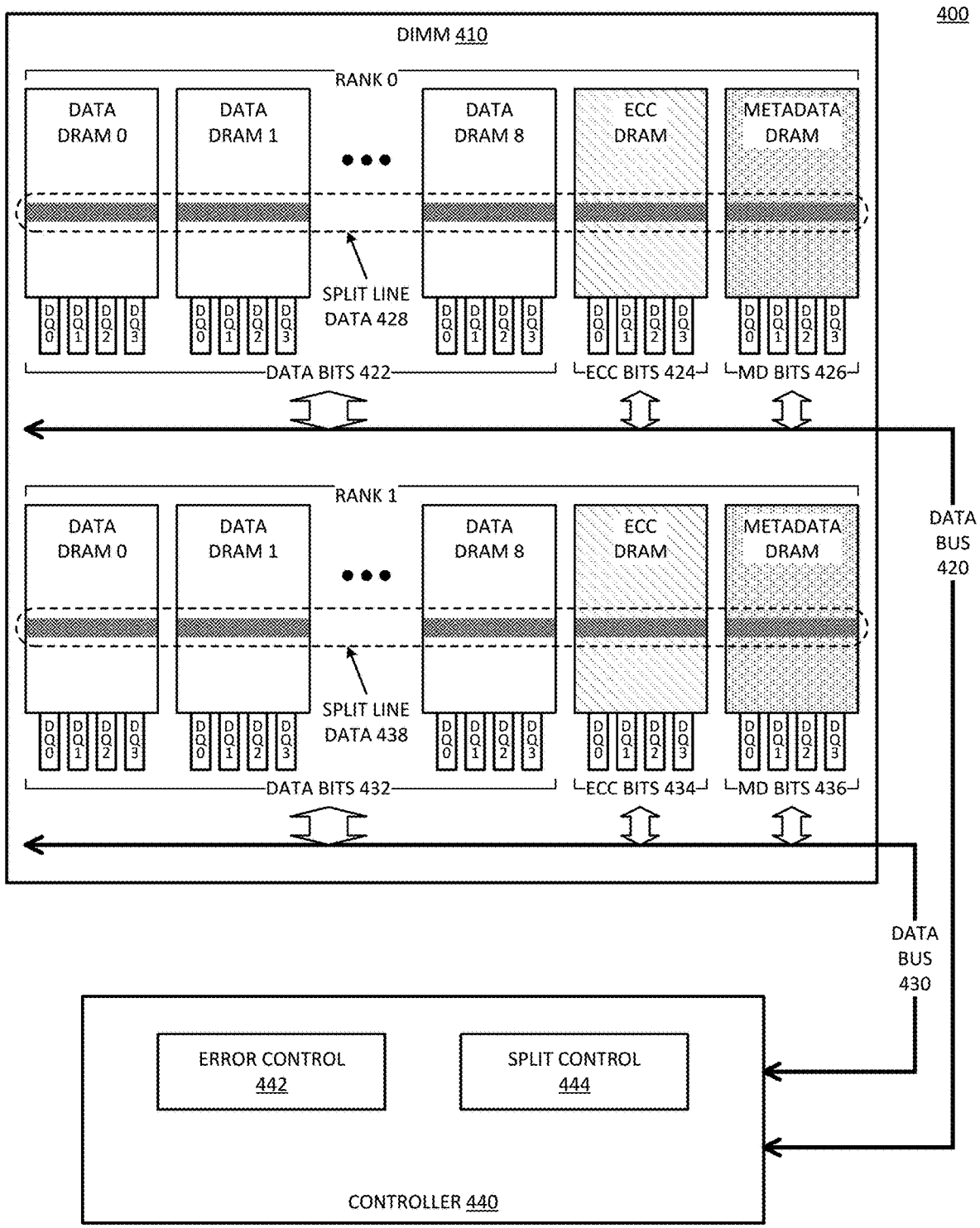
FIG. 4 is a block diagram of an example of a system architecture for split line access for a dual rank 10×4 memory module.

FIG. 4 is a block diagram of an example of a system architecture for split line access for a dual rank 10×4 memory module. System 400 represents a system in accordance with an example of system 100 or an example of system 300.

DIMM 410 specifically illustrates a configuration of a two-rank 10×4 implementation, each rank having 8 data DRAMs, DRAM[0:7], one ECC DRAM, and one metadata DRAM. All data DRAMs DRAM[0:7], the ECC DRAM, and the metadata DRAM are illustrated as having x4 interfaces, with DQ[0:3]. In one example, instead of a two-rank DIMM, system 400 could include two separate DIMMs in parallel.

In one example, the DRAMs of Rank 0 are connected to data bus 420, with the data DRAMs to provide data bits 422, the ECC DRAM to provide ECC bits 424, and the metadata DRAM to provide metadata (MD) bits 426. In one example, the DRAMs of Rank 1 are connected to data bus 430, with the data DRAMs to provide data bits 432, the ECC DRAM to provide ECC bits 434, and the metadata DRAM to provide metadata (MD) bits 436.

Split line data 428 represents the half portion of data in Rank 0, and split line data 438 represents the half portion of data in Rank 1. Controller 440 represents a controller of a host device that controls memory access to DIMM 410. Error control 442 represents capability of controller 440 to perform ECC on data bits based on ECC bits. For data that is not treated as split line data on data bus 420, error control 442 will perform ECC on the data bits based on ECC that is stored in Rank 0. For data that is not split line data on data bus 430, error control 442 will perform ECC on the data bits based on ECC that is stored in Rank 1. In both cases, the ranks will be treated individually. In such an example, the DRAMs identified as metadata DRAM will store ECC data for the non-split line data.

In one example, split control 444 determines to store data as split data between the two ranks to free up the ECC capacity as metadata. In one example, split control 444 determines to split data of Rank 0 across Rank 0 and Rank 1. In one example, split control 444 determines to split data of Rank 1 across Rank 0 and Rank 1.

Figure 5:
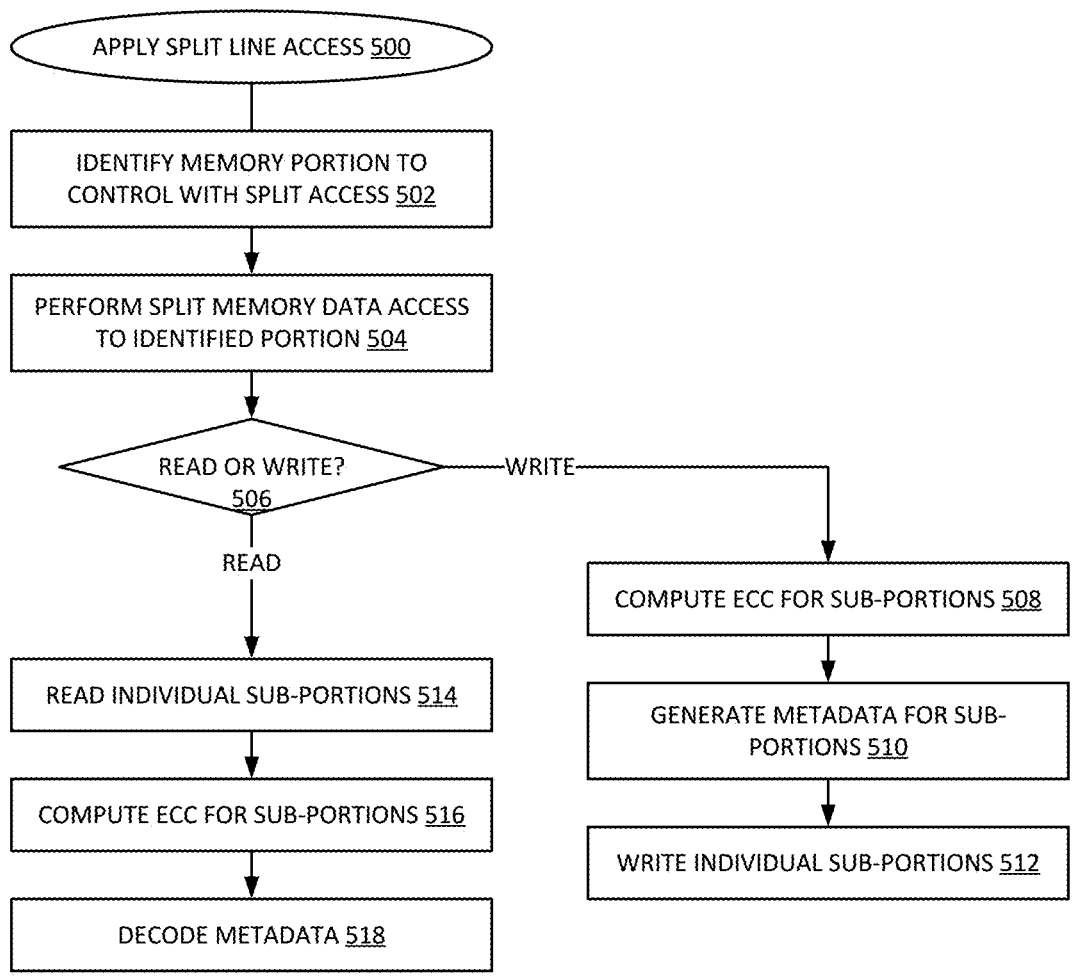
FIG. 5 is a flow diagram of an example of a process for splitting data and error correction among parallel memory resources.

FIG. 5 is a flow diagram of an example of a process for splitting data and error correction among parallel memory resources. Process 500 represents an example of a process to apply split line access to parallel memory resources in accordance with any example herein. Process 500 represents an example of a process that can be executed by a memory controller in accordance with system 100, system 300, and system 400.

In one example, the controller identifies a memory portion to control with split access, referring to splitting data across parallel memory resources, at 502. In one example, the controller performs split memory data access for the identified portion, at 504. The memory data access can be a read or a write, at 506.

For a write access, at 506 WRITE branch, in one example, the controller computes ECC for separate sub-portions, at 508. The computation of ECC would be computed separately for the different sub-portions, and the ECC bit pattern will be different than the ECC for all data stored in one memory resource as opposed to spread across multiple resources. There are fewer ECC bits when the data is split among the parallel resources. Thus, for the split data access, there are available bits for metadata. In one example, the controller generates metadata for the sub-portions, at 510. The controller can write individual sub-portions with the ECC data and metadata, at 512.

For a read access, at 506 READ branch, in one example, the controller read individual sub-portions for the desired data instead of reading all data from one memory resource, at 514. The controller computes ECC for the separate sub-portions, at 516. In one example, the controller decodes the metadata for the sub-portions, at 518.

Figure 6:
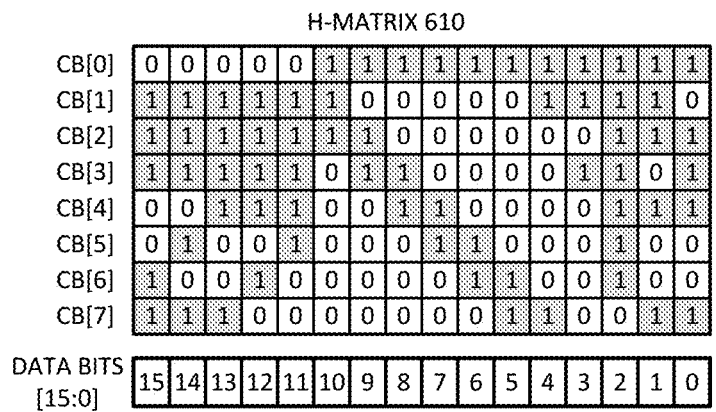
FIG. 6 is a block diagram of an example of check bit generation logic and syndrome bit generation logic to apply a matrix to perform checking and correction based on split line ECC.
Figure 6:
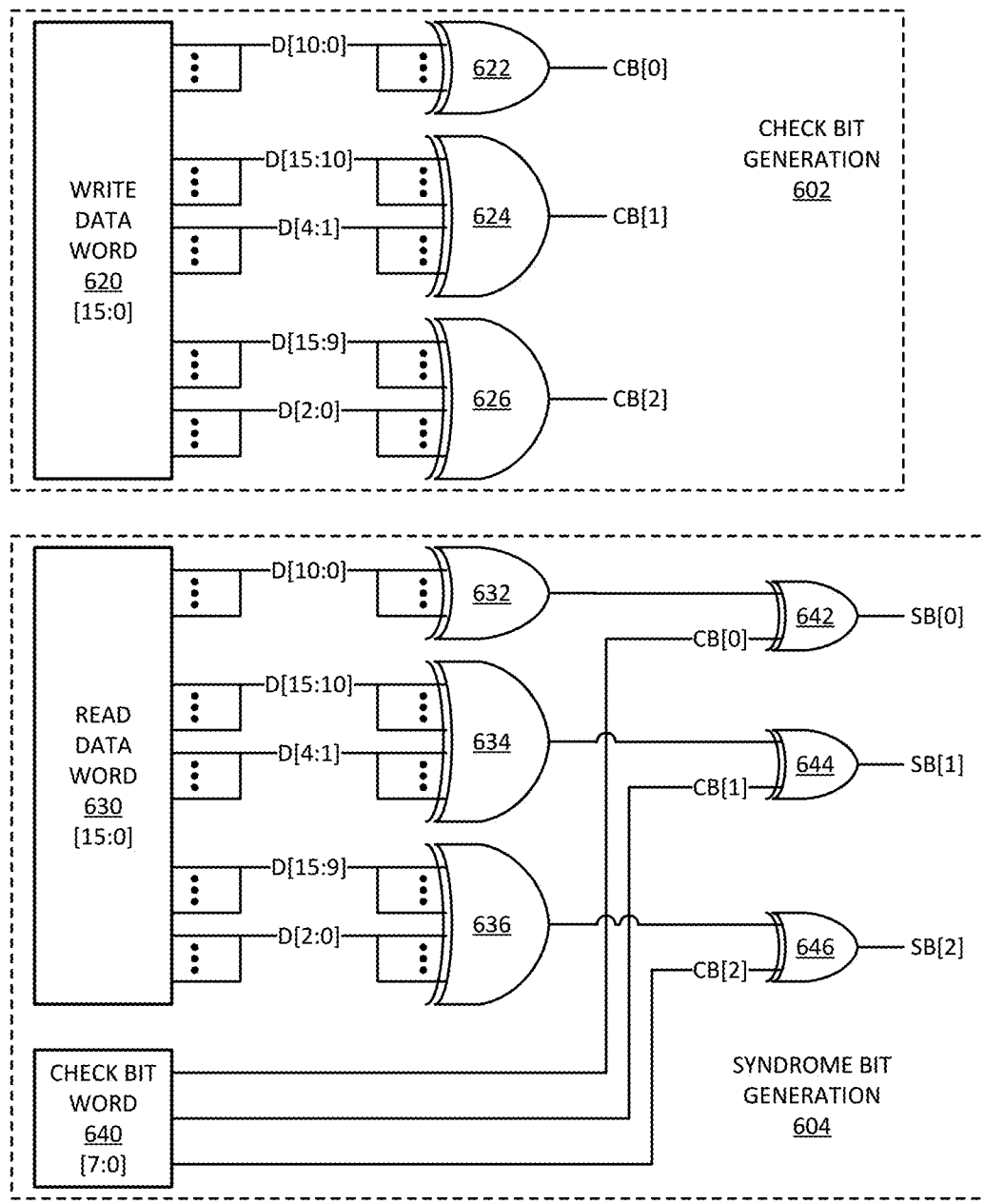

FIG. 6 is a block diagram of an example of check bit generation logic and syndrome bit generation logic to apply a matrix to perform checking and correction based on split line ECC. H-matrix 610 represents a simplified example of the application of ECC by a memory controller for system ECC.

H matrix 610 represents an example of 16 bits of a code matrix for use with on-device ECC. It will be understood that a typical operational code word in modern computing systems includes more than 16 bits. However, the 16-bit H-matrix illustrates principles of ECC operation for either on-die ECC to be used in on-memory error checking and correction in accordance with any example herein or for system level ECC by the memory controller or error control in accordance with any example herein.

Matrix 610 can be part of an SEC Hamming code, such as a hamming code for a 128-bit code word. Matrix 610 illustrates only 16 codes, one code bit for each data bit [15:0]. In one example, every code of matrix 610 corresponds to one data bit. In the example illustrated, each code includes 8 check bits CB[0:7]. When a syndrome is computed from the data word and check bits stored in the memory, the ECC engine can determine if the syndrome corresponds to one of the codes in matrix 610. If the ECC engine determines a syndrome matches with one of the codes, the ECC engine toggles the corresponding data bit to correct an error. Examples of check bit generation and syndrome bit generation are illustrated.

Check bit generation logic 602 represents logic to perform ECC operations to generate check bits. Syndrome bit generation logic 604 represents logic to perform ECC operations to generate syndrome bits to compare against the check bit. For purposes of illustration in the drawing, only logic related to check bits CB[0:2] are illustrated, and correspondingly, only syndrome bits SB[0:2] are illustrated.

As illustrated, the syndrome can be completely encoded in the ECC logic for the check bit generation and syndrome bit generation. In one example, check bit generation 602 includes XOR gates to receive write data word 620 and perform XOR operations for the one-bits of the code. For example, generation of CB[0] with respect to the 16 code word bits illustrated, bits D[10:0] are all ones, whereas bits D[15:11] are zeros. Thus, in one example, computation of CB[0] includes the XOR operation with XOR 622 of bits D[10:0] of the code word. Similarly, generation of the syndrome bit SB[0] includes logic to receive read data word 630 and perform XOR operation with XOR 632 of bits D[10:0] of the read data code word. The output of XOR 632 is then XORed with XOR 642 with CB[0] to generate SB[0].

It will be understood that as a technical matter, a true XOR operation can only exist for two inputs, where an output is one if and only if only one of the inputs is one. However, it is common convention to represent a cascade of XOR operations as a multi-input XOR (meaning a number of inputs greater than 2), such as XOR 622 for CB[0] and XOR 632 for SB[0]. The XOR operation has a commutative property, and the XORing of multiple pairs of inputs, and then the series XORing of the outputs of those operations can be interchanged in any order with the same result. Thus, the XOR operations have the practical effect of modulo 2 addition, which is also equivalent to odd parity detection. Odd parity detection provides a '1' as the output when there is an odd number of ones among the inputs, and an output zero when there is an even number of ones among the inputs.

In another example, generation of CB[1] with respect to the 16 code word bits illustrated, bits D[15:10] and D[4:1] are ones, and bits D[9:5] and D[0] are zeros. XOR 624 computes CB[1] from the one bits. Similarly, for the generation of CB[2], bits D[15:9] and D[2:0] are ones, and bits D[8:3] are zeros. XOR 626 computes CB[2] from the one bits.

Syndrome bit generation 604 represents logic to receive read data word 630 and check bit word 640, and generate the syndrome bits by comparison of the CB computation with the stored check bits. Similarly, syndrome bit generation of SB[1] with respect to the 16 code word bits illustrated, XOR 634 computes an XOR of D[15:10] and D[4:1], and then XOR 644 computes SB[1] by XOR of CB[1] with the output of XOR 634. Similarly, syndrome bit generation of SB[2] with respect to the 16 code word bits illustrated, XOR 636 computes an XOR of D[15:9] and D[2:0], and then XOR 646 computes SB[2] by XOR of CB[2] with the output of XOR 636.

Based on the determination of the check bits and syndrome bits, the system can identify errors and potentially flip bits, e.g., for a bit or column of CB[7:0] found to match with the syndrome bits. The ECS system applies such techniques to perform scrubbing on memory addresses. In one example, a system applied the error detection of the ECC to detect memory errors and provide error information to the memory controller to allow the memory controller to detect error patterns and adjust the error scrub operations in accordance with any example herein.

Figure 7:
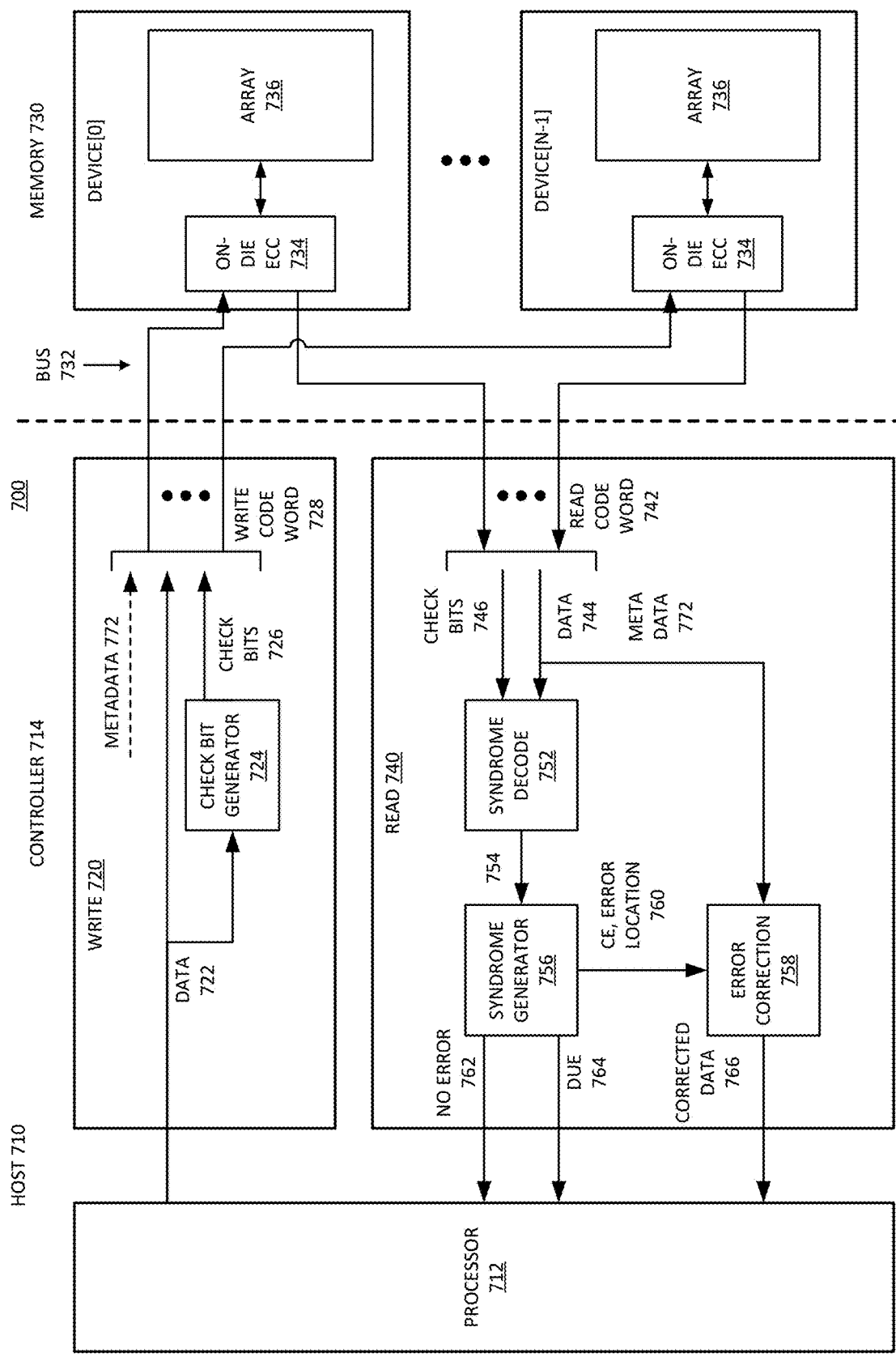
FIG. 7 is a block diagram of an example of system level error checking and correction.

FIG. 7 is a block diagram of an example of system level error checking and correction. System 700 provides an example of system level ECC circuitry for a system in accordance with any example of host side or memory controller ECC herein. Host 710 includes controller 714 or equivalent or alternative logic or circuit or component that manages access to memory 730. Controller 714 performs external ECC on data read from memory 730. In one example, memory 730 implements on-die ECC 734 to check and correct data from array 736 prior to sending the data over bus 732 to host 710.

Host 710 includes processor 712 to execute operations that will generate requests for data stored in array 736 of memory 730. In response to a request to write data, controller 714 can generate a write command through write path 720. For a read request, controller 714 receives read data through read path 740.

Write path 720 represents a path for data written from processor 712 to memory 730. Processor 712 provides data 722 for writing to memory 730. In one example, controller 714 generates check bits 726 with check bit generator 724 to store with the data in memory. Check bits 726 can be referred to as ECC bits, and enable error correction for an error that might occur in the writing to and reading from the memory array(s). Data 722 and check bits 726 can be included as code word in 728, which is written to memory 730, over data bus 732 into array 736.

Read path 740 represents a path for data read from memory 730 to host 710. In one example, at least certain hardware components of write path 720 and read path 740 are the same hardware. In one example, memory 730 fetches the data in response to a Read command from host 710. Read code word 742 represents the data and check bits that were stored in array 736. Data 744 and check bits 746 represent the data and check bits of read code word 742. Read code word 742 represents a codeword made up of data from Device[0:(N−1)]. In one example, these correspond, respectively, to data 722 and check bits 726 written in write path 720 to the same address of the read command.

In one example, write codeword 728 is provided to multiple parallel resources for split line access. With split line access, in one example, controller 714 can generate metadata 772. Thus, write codeword 728 can include metadata 772 to save to memory 730. In one example, with split line access can include metadata 772, which can be provided to the host with the data. In one example, the metadata can bypass error correction 758.

Read path 740 includes syndrome decode 752 to apply H matrix computations on data 744 and check bits 746 to detect errors in the read data. Syndrome decode 752 can generate syndrome 754 for use in generating appropriate error information for the read data. Data 744 can also be forwarded to error correction 758 for correction of a detected error.

In one example, syndrome decode 752 passes syndrome 754 to syndrome generator 756 to generate an error vector. In one example, check bit generator 724 and syndrome generator 756 are fully specified by a corresponding H matrix. In one example, if there are no errors in the read data (e.g., zero syndrome 754), syndrome generator 756 generates a no error signal 762. In one example, if there are multiple errors in the read data (e.g., non-zero syndrome 754 that does not match any of the columns in a corresponding H matrix), syndrome generator 756 generates a DUE (detected uncorrected error) signal 764. DUE signal 764 can indicate a multibit error that was not able to be corrected by the application of ECC.

In one example, if there is a single bit error (e.g., non-zero syndrome 754 that matches one of the columns of a corresponding H matrix), syndrome generator 756 can generate a CE (corrected error) signal with error location 760, which is a corrected error indication to error correction logic 758. Error correction 758 can apply the corrected error to the specified location in data 744 to generate corrected data 766 for output to provide to processor 712.

Figure 8:
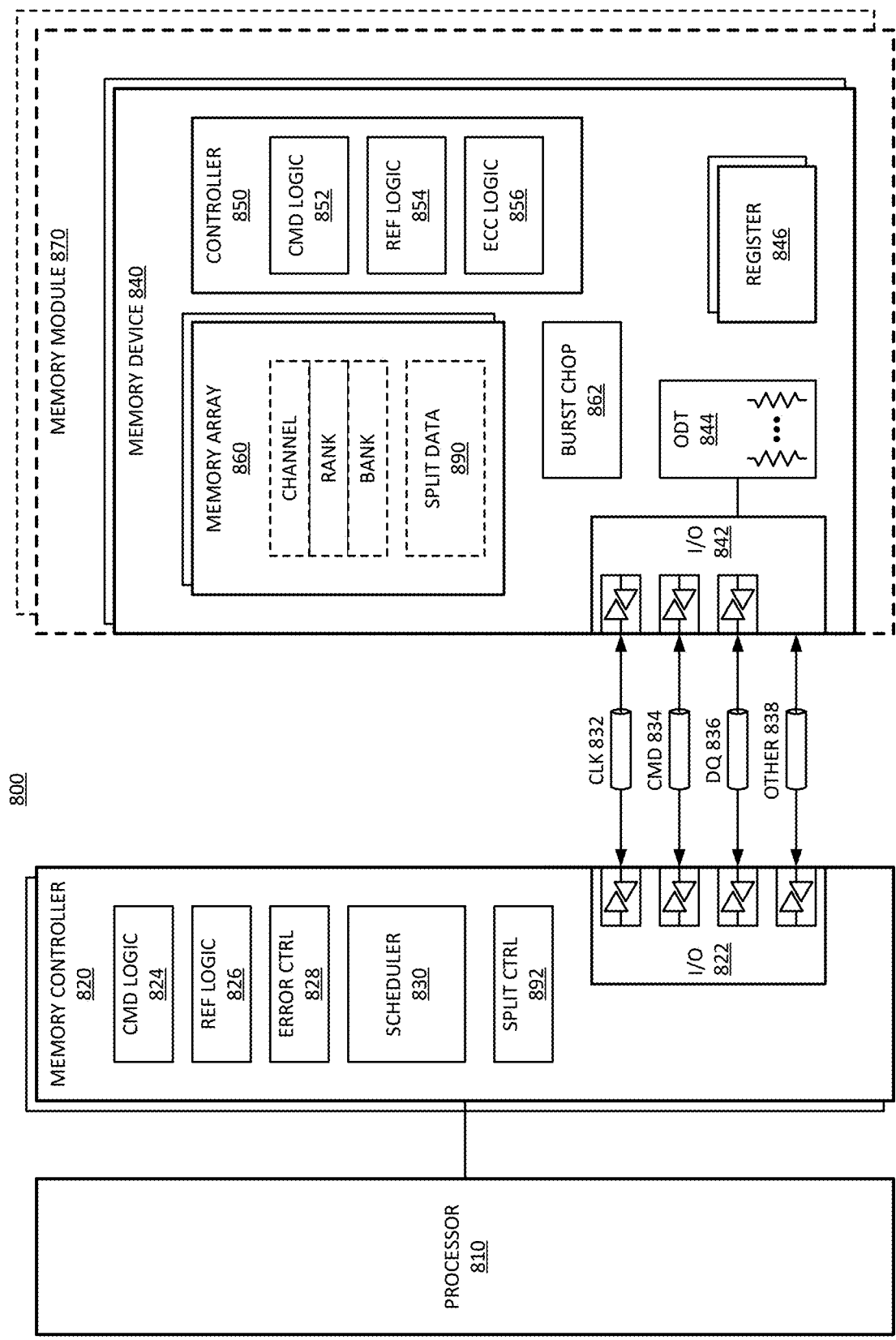
FIG. 8 is a block diagram of an example of a memory subsystem in which split line memory access can be implemented.

FIG. 8 is a block diagram of an example of a memory subsystem in which split line memory access can be implemented. System 800 includes a processor and elements of a memory subsystem in a computing device. System 800 is an example of a system in accordance with an example of system 100 or system 300.

In one example, controller 850 of memory device 840 includes ECC logic 856. ECC logic 856 represents on-die ECC for memory device 840, to enable error checking and correction in the memory. In one example, memory controller 820 includes error control 828, which represents logic within memory controller 820 to enable determinations about errors in data from memory in accordance with any example herein. In one example, error control 828 can perform ECC in accordance with any description herein. In one example, memory controller 820 includes split control (CTRL) 892 to control the access to memory devices 840 as parallel resources with split line access in accordance with any example herein. The split control enables the providing of data to multiple resources, which frees up data capacity that can be used as metadata instead of ECC data. In one example, memory array 860 includes split data 890 to represent split data in accordance with any example herein. In one example, memory device 840 includes burst chop 862 to perform burst chop on split access data.

Processor 810 represents a processing unit of a computing platform that may execute an operating system (OS) and applications, which can collectively be referred to as the host or the user of the memory. The OS and applications execute operations that result in memory accesses. Processor 810 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 800 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random-access memory), or some variant such as synchronous DRAM (SDRAM). A memory subsystem as described herein may be compatible with a number of memory technologies, such as DDR4 (double data rate version 4, JESD79-4, originally published in September 2012 by JEDEC (Joint Electron Device Engineering Council, now the JEDEC Solid State Technology Association), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, originally published by JEDEC in July 2020), LPDDR5 (LPDDR version 5, JESD209-5, originally published by JEDEC in February 2019), HBM2 ((HBM version 2), currently in discussion by JEDEC), or others or combinations of memory technologies, and technologies based on derivatives or extensions of such specifications.

In addition to, or alternatively to, volatile memory, in one example, the memory module can be a persistent memory DIMM or nonvolatile system memory, referring to nonvolatile memory connected to the system memory bus. Such a memory device can include a three dimensional crosspoint (3DXP) memory device. 3DXP can operate as a byte addressable nonvolatile memory device or as a block addressable nonvolatile memory device. A memory device can include a nonvolatile, byte addressable media or block addressable media that stores data based on a resistive state of the memory cell, or a phase of the memory cell. In one example, the memory device can use chalcogenide phase change material (e.g., chalcogenide glass). In one example, the system memory device can be or include NAND flash memory, NOR flash memory, single or multi-level phase change memory (PCM) or phase change memory with a switch (PCMS), a resistive memory, nanowire memory, ferroelectric transistor random-access memory (FeTRAM), magnetoresistive random-access memory (MRAM) memory that incorporates memristor technology, or spin transfer torque (STT)-MRAM, or a combination of any of the above, or other memory.

Memory controller 820 represents one or more memory controller circuits or devices for system 800. Memory controller 820 represents control logic that generates memory access commands in response to the execution of operations by processor 810. Memory controller 820 accesses one or more memory devices 840. Memory devices 840 can be DRAM devices in accordance with any referred to above. In one example, memory devices 840 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 820 manages a separate memory channel, although system 800 can be configured to have multiple channels managed by a single controller, or to have multiple controllers on a single channel. In one example, memory controller 820 is part of host processor 810, such as logic implemented on the same die or implemented in the same package space as the processor.

Memory controller 820 includes I/O interface logic 822 to couple to a memory bus, such as a memory channel as referred to above. I/O interface logic 822 (as well as I/O interface logic 842 of memory device 840) can include pins, pads, connectors, signal lines, traces, or wires, or other hardware to connect the devices, or a combination of these. I/O interface logic 822 can include a hardware interface. As illustrated, I/O interface logic 822 includes at least drivers/transceivers for signal lines. Commonly, wires within an integrated circuit interface couple with a pad, pin, or connector to interface signal lines or traces or other wires between devices. I/O interface logic 822 can include drivers, receivers, transceivers, or termination, or other circuitry or combinations of circuitry to exchange signals on the signal lines between the devices. The exchange of signals includes at least one of transmit or receive. While shown as coupling I/O 822 from memory controller 820 to I/O 842 of memory device 840, it will be understood that in an implementation of system 800 where groups of memory devices 840 are accessed in parallel, multiple memory devices can include I/O interfaces to the same interface of memory controller 820. In an implementation of system 800 including one or more memory modules 870, I/O 842 can include interface hardware of the memory module in addition to interface hardware on the memory device itself. Other memory controllers 820 will include separate interfaces to other memory devices 840.

The bus between memory controller 820 and memory devices 840 can be implemented as multiple signal lines coupling memory controller 820 to memory devices 840. The bus may typically include at least clock (CLK) 832, command/address (CMD) 834, and write data (DQ) and read data (DQ) 836, and zero or more other signal lines 838. In one example, a bus or connection between memory controller 820 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 800 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 820 and memory devices 840. An example of a serial bus technology is 8B10B encoding and transmission of high-speed data with embedded clock over a single differential pair of signals in each direction. In one example, CMD 834 represents signal lines shared in parallel with multiple memory devices. In one example, multiple memory devices share encoding command signal lines of CMD 834, and each has a separate chip select (CS_n) signal line to select individual memory devices.

It will be understood that in the example of system 800, the bus between memory controller 820 and memory devices 840 includes a subsidiary command bus CMD 834 and a subsidiary bus to carry the write and read data, DQ 836. In one example, the data bus can include bidirectional lines for read data and for write/command data. In another example, the subsidiary bus DQ 836 can include unidirectional write signal lines for write and data from the host to memory, and can include unidirectional lines for read data from the memory to the host. In accordance with the chosen memory technology and system design, other signals 838 may accompany a bus or sub bus, such as strobe lines DQS. Based on design of system 800, or implementation if a design supports multiple implementations, the data bus can have more or less bandwidth per memory device 840. For example, the data bus can support memory devices that have either a x4 interface, a x8 interface, a x16 interface, or other interface. The convention "xW," where W is an integer that refers to an interface size or width of the interface of memory device 840, which represents a number of signal lines to exchange data with memory controller 820. The interface size of the memory devices is a controlling factor on how many memory devices can be used concurrently per channel in system 800 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 840 and memory controller 820 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 840 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 840 represent memory resources for system 800. In one example, each memory device 840 is a separate memory die. In one example, each memory device 840 can interface with multiple (e.g., 2) channels per device or die. Each memory device 840 includes I/O interface logic 842, which has a bandwidth determined by the implementation of the device (e.g., x16 or x8 or some other interface bandwidth). I/O interface logic 842 enables the memory devices to interface with memory controller 820. I/O interface logic 842 can include a hardware interface, and can be in accordance with I/O 822 of memory controller, but at the memory device end. In one example, multiple memory devices 840 are connected in parallel to the same command and data buses. In another example, multiple memory devices 840 are connected in parallel to the same command bus, and are connected to different data buses. For example, system 800 can be configured with multiple memory devices 840 coupled in parallel, with each memory device responding to a command, and accessing memory resources 860 internal to each. For a Write operation, an individual memory device 840 can write a portion of the overall data word, and for a Read operation, an individual memory device 840 can fetch a portion of the overall data word. The remaining bits of the word will be provided or received by other memory devices in parallel.

In one example, memory devices 840 are disposed directly on a motherboard or host system platform (e.g., a PCB (printed circuit board) on which processor 810 is disposed) of a computing device. In one example, memory devices 840 can be organized into memory modules 870. In one example, memory modules 870 represent dual inline memory modules (DIMMs). In one example, memory modules 870 represent other organization of multiple memory devices to share at least a portion of access or control circuitry, which can be a separate circuit, a separate device, or a separate board from the host system platform. Memory modules 870 can include multiple memory devices 840, and the memory modules can include support for multiple separate channels to the included memory devices disposed on them. In another example, memory devices 840 may be incorporated into the same package as memory controller 820, such as by techniques such as multi-chip-module (MCM), package-on-package, through-silicon via (TSV), or other techniques or combinations. Similarly, in one example, multiple memory devices 840 may be incorporated into memory modules 870, which themselves may be incorporated into the same package as memory controller 820. It will be appreciated that for these and other implementations, memory controller 820 may be part of host processor 810.

Memory devices 840 each include one or more memory arrays 860. Memory array 860 represents addressable memory locations or storage locations for data. Typically, memory array 860 is managed as rows of data, accessed via wordline (rows) and bitline (individual bits within a row) control. Memory array 860 can be organized as separate channels, ranks, and banks of memory. Channels may refer to independent control paths to storage locations within memory devices 840. Ranks may refer to common locations across multiple memory devices (e.g., same row addresses within different devices) in parallel. Banks may refer to sub-arrays of memory locations within a memory device 840. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 840 include one or more registers 844. Register 844 represents one or more storage devices or storage locations that provide configuration or settings for the operation of the memory device. In one example, register 844 can provide a storage location for memory device 840 to store data for access by memory controller 820 as part of a control or management operation. In one example, register 844 includes one or more Mode Registers. In one example, register 844 includes one or more multipurpose registers. The configuration of locations within register 844 can configure memory device 840 to operate in different "modes," where command information can trigger different operations within memory device 840 based on the mode. Additionally or in the alternative, different modes can also trigger different operation from address information or other signal lines depending on the mode. Settings of register 844 can indicate configuration for I/O settings (e.g., timing, termination or ODT (on-die termination) 846, driver configuration, or other I/O settings).

In one example, memory device 840 includes ODT 846 as part of the interface hardware associated with I/O 842. ODT 846 can be configured as mentioned above, and provide settings for impedance to be applied to the interface to specified signal lines. In one example, ODT 846 is applied to DQ signal lines. In one example, ODT 846 is applied to command signal lines. In one example, ODT 846 is applied to address signal lines. In one example, ODT 846 can be applied to any combination of the preceding. The ODT settings can be changed based on whether a memory device is a selected target of an access operation or a non-target device. ODT 846 settings can affect the timing and reflections of signaling on the terminated lines. Careful control over ODT 846 can enable higher-speed operation with improved matching of applied impedance and loading. ODT 846 can be applied to specific signal lines of I/O interface 842, 822 (for example, ODT for DQ lines or ODT for CA lines), and is not necessarily applied to all signal lines.

Memory device 840 includes controller 850, which represents control logic within the memory device to control internal operations within the memory device. For example, controller 850 decodes commands sent by memory controller 820 and generates internal operations to execute or satisfy the commands. Controller 850 can be referred to as an internal controller, and is separate from memory controller 820 of the host. Controller 850 can determine what mode is selected based on register 844, and configure the internal execution of operations for access to memory resources 860 or other operations based on the selected mode. Controller 850 generates control signals to control the routing of bits within memory device 840 to provide a proper interface for the selected mode and direct a command to the proper memory locations or addresses. Controller 850 includes command logic 852, which can decode command encoding received on command and address signal lines. Thus, command logic 852 can be or include a command decoder. With command logic 852, memory device can identify commands and generate internal operations to execute requested commands.

Referring again to memory controller 820, memory controller 820 includes command (CMD) logic 824, which represents logic or circuitry to generate commands to send to memory devices 840. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 840, memory controller 820 can issue commands via I/O 822 to cause memory device 840 to execute the commands. In one example, controller 850 of memory device 840 receives and decodes command and address information received via I/O 842 from memory controller 820. Based on the received command and address information, controller 850 can control the timing of operations of the logic and circuitry within memory device 840 to execute the commands. Controller 850 is responsible for compliance with standards or specifications within memory device 840, such as timing and signaling requirements. Memory controller 820 can implement compliance with standards or specifications by access scheduling and control.

Memory controller 820 includes scheduler 830, which represents logic or circuitry to generate and order transactions to send to memory device 840. From one perspective, the primary function of memory controller 820 could be said to schedule memory access and other transactions to memory device 840. Such scheduling can include generating the transactions themselves to implement the requests for data by processor 810 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 820 typically includes logic such as scheduler 830 to allow selection and ordering of transactions to improve performance of system 800. Thus, memory controller 820 can select which of the outstanding transactions should be sent to memory device 840 in which order, which is typically achieved with logic much more complex that a simple first-in first-out algorithm. Memory controller 820 manages the transmission of the transactions to memory device 840, and manages the timing associated with the transaction. In one example, transactions have deterministic timing, which can be managed by memory controller 820 and used in determining how to schedule the transactions with scheduler 830.

In one example, memory controller 820 includes refresh (REF) logic 826. Refresh logic 826 can be used for memory resources that are volatile and need to be refreshed to retain a deterministic state. In one example, refresh logic 826 indicates a location for refresh, and a type of refresh to perform. Refresh logic 826 can trigger self-refresh within memory device 840, or execute external refreshes which can be referred to as auto refresh commands) by sending refresh commands, or a combination. In one example, controller 850 within memory device 840 includes refresh logic 854 to apply refresh within memory device 840. In one example, refresh logic 854 generates internal operations to perform refresh in accordance with an external refresh received from memory controller 820. Refresh logic 854 can determine if a refresh is directed to memory device 840, and what memory resources 860 to refresh in response to the command.

Figure 9:
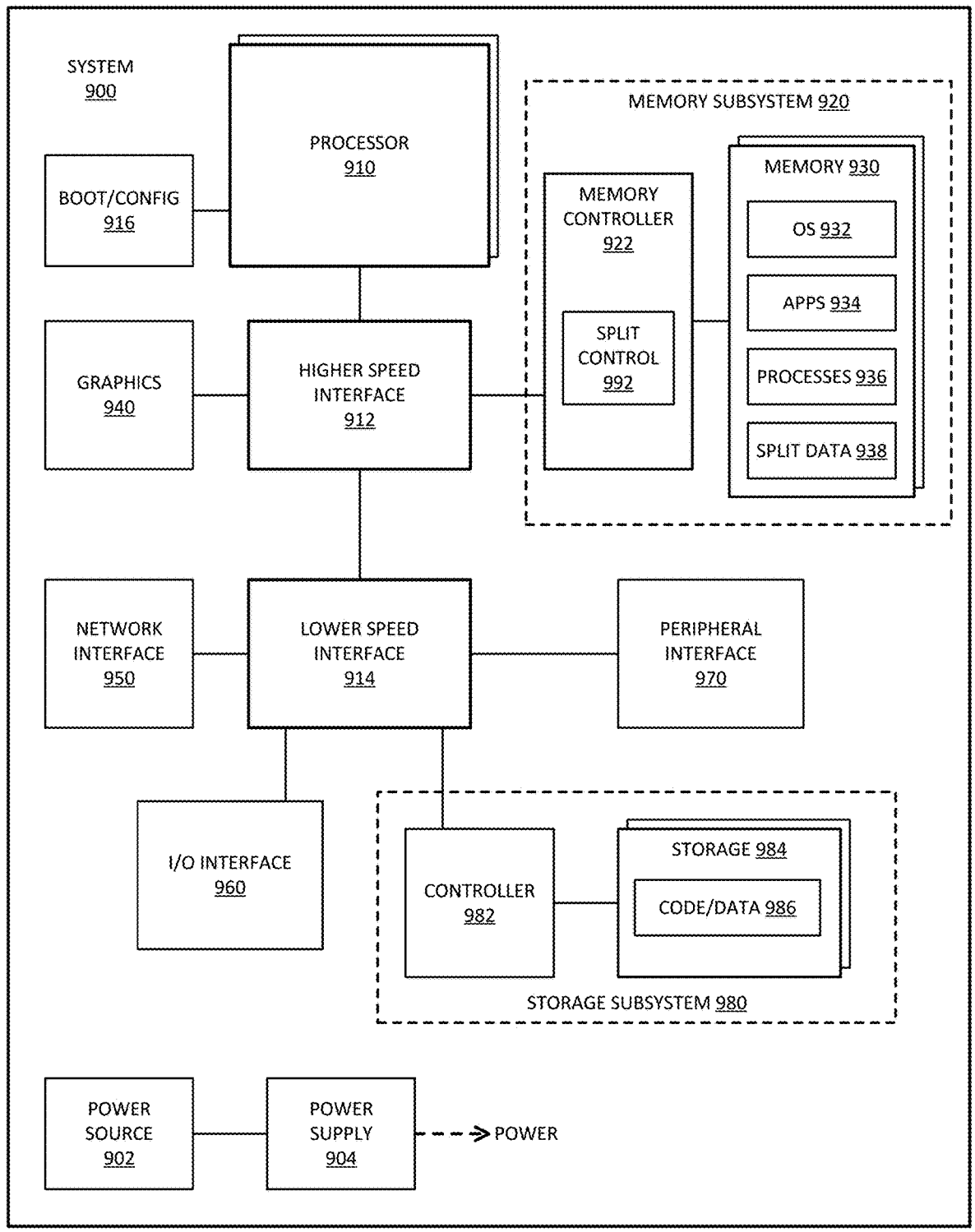
FIG. 9 is a block diagram of an example of a computing system in which split line memory access can be implemented.

FIG. 9 is a block diagram of an example of a computing system in which split line memory access can be implemented. System 900 represents a computing device in accordance with any example herein, and can be a laptop computer, a desktop computer, a tablet computer, a server, a gaming or entertainment control system, embedded computing device, or other electronic device. System 900 represents a system in accordance with an example of system 100 or system 300.

In one example, memory controller 922 includes split control 992 to control the access to memory 930 as parallel resources with split line access in accordance with any example herein. The split control enables the providing of data to multiple resources, which frees up data capacity that can be used as metadata instead of ECC data, in accordance with any example herein. In one example, memory 930 includes split data 938 to represent split data in accordance with any example herein.

System 900 includes processor 910 can include any type of microprocessor, central processing unit (CPU), graphics processing unit (GPU), processing core, or other processing hardware, or a combination, to provide processing or execution of instructions for system 900. Processor 910 can be a host processor device. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or a combination of such devices.

System 900 includes boot/config 916, which represents storage to store boot code (e.g., basic input/output system (BIOS)), configuration settings, security hardware (e.g., trusted platform module (TPM)), or other system level hardware that operates outside of a host OS. Boot/config 916 can include a nonvolatile storage device, such as read-only memory (ROM), flash memory, or other memory devices.

In one example, system 900 includes interface 912 coupled to processor 910, which can represent a higher speed interface or a high throughput interface for system components that need higher bandwidth connections, such as memory subsystem 920 or graphics interface components 940. Interface 912 represents an interface circuit, which can be a standalone component or integrated onto a processor die. Interface 912 can be integrated as a circuit onto the processor die or integrated as a component on a system on a chip. Where present, graphics interface 940 interfaces to graphics components for providing a visual display to a user of system 900. Graphics interface 940 can be a standalone component or integrated onto the processor die or system on a chip. In one example, graphics interface 940 can drive a high definition (HD) display or ultra high definition (UHD) display that provides an output to a user. In one example, the display can include a touchscreen display. In one example, graphics interface 940 generates a display based on data stored in memory 930 or based on operations executed by processor 910 or both.

Memory subsystem 920 represents the main memory of system 900, and provides storage for code to be executed by processor 910, or data values to be used in executing a routine. Memory subsystem 920 can include one or more varieties of random-access memory (RAM) such as DRAM, 3DXP (three-dimensional crosspoint), or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910, such as integrated onto the processor die or a system on a chip.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 900 includes interface 914, which can be coupled to interface 912. Interface 914 can be a lower speed interface than interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, NAND, 3DXP, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 900 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

Figure 10:
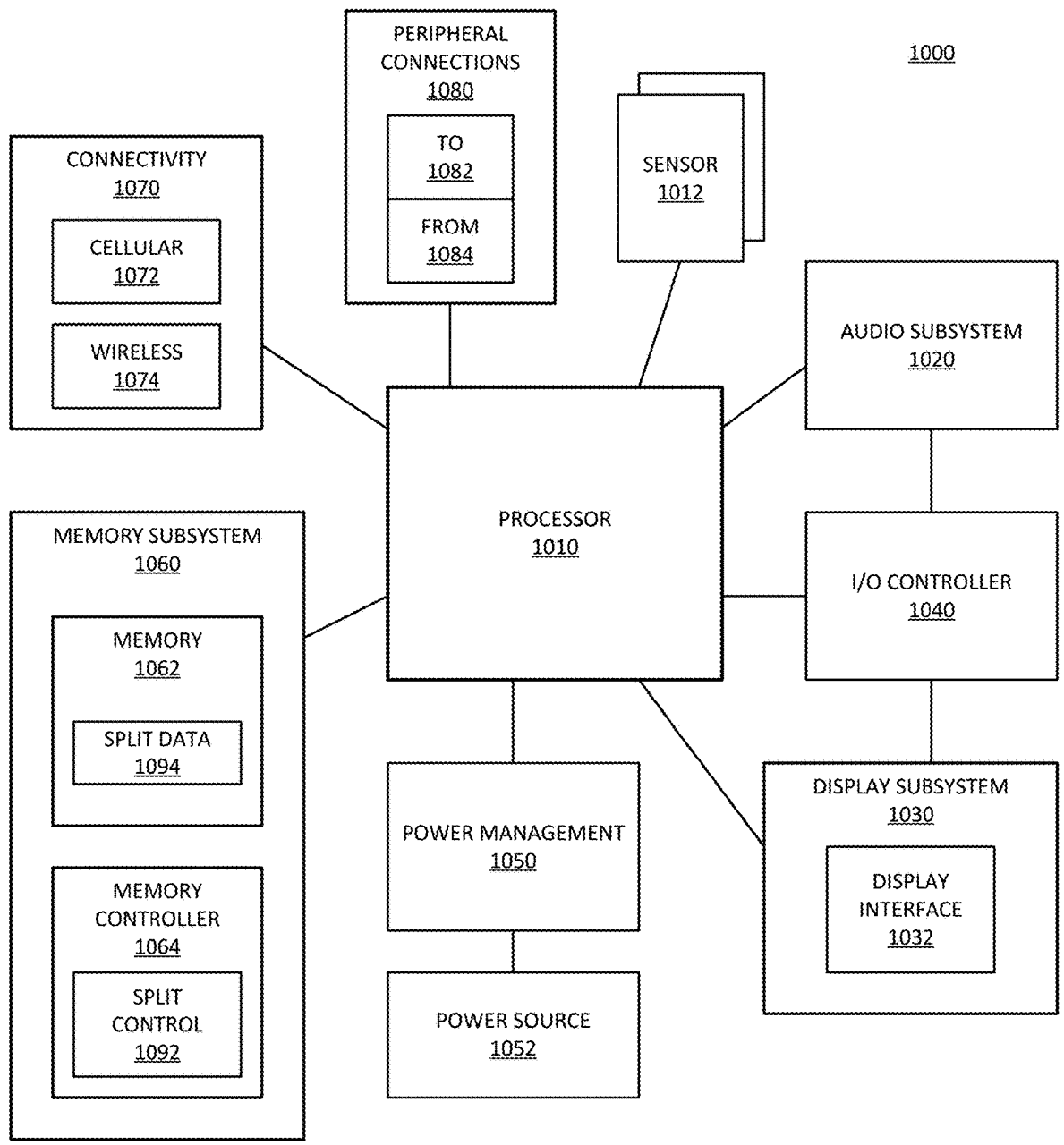
FIG. 10 is a block diagram of an example of a mobile device in which split line memory access can be implemented.

FIG. 10 is a block diagram of an example of a mobile device in which split line memory access can be implemented. System 1000 represents a mobile computing device, such as a computing tablet, a mobile phone or smartphone, wearable computing device, or other mobile device, or an embedded computing device. It will be understood that certain of the components are shown generally, and not all components of such a device are shown in system 1000. System 1000 represents a system in accordance with an example of system 100 or system 300.

In one example, memory controller 1064 includes split control 1092 to control the access to memory 1062 as parallel resources with split line access in accordance with any example herein. The split control enables the providing of data to multiple resources, which frees up data capacity that can be used as metadata instead of ECC data, in accordance with any example herein. In one example, memory 1062 includes split data 1094 to represent split data in accordance with any example herein.

System 1000 includes processor 1010, which performs the primary processing operations of system 1000. Processor 1010 can be a host processor device. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting system 1000 to another device, or a combination. The processing operations can also include operations related to audio I/O, display I/O, or other interfacing, or a combination. Processor 1010 can execute data stored in memory. Processor 1010 can write or edit data stored in memory.

In one example, system 1000 includes one or more sensors 1012. Sensors 1012 represent embedded sensors or interfaces to external sensors, or a combination. Sensors 1012 enable system 1000 to monitor or detect one or more conditions of an environment or a device in which system 1000 is implemented. Sensors 1012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1012 can also include sensors for biometric systems such as fingerprint recognition systems, face detection or recognition systems, or other systems that detect or recognize user features. Sensors 1012 should be understood broadly, and not limiting on the many different types of sensors that could be implemented with system 1000. In one example, one or more sensors 1012 couples to processor 1010 via a frontend circuit integrated with processor 1010. In one example, one or more sensors 1012 couples to processor 1010 via another component of system 1000.

In one example, system 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1000, or connected to system 1000. In one example, a user interacts with system 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user. In one example, display subsystem 1030 includes a high definition (HD) or ultra-high definition (UHD) display that provides an output to a user. In one example, display subsystem includes or drives a touchscreen display. In one example, display subsystem 1030 generates display information based on data stored in memory or based on operations executed by processor 1010 or both.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to system 1000 through which a user might interact with the system. For example, devices that can be attached to system 1000 might include microphone devices, speaker or stereo systems, video systems or other display device, keyboard or keypad devices, buttons/switches, or other I/O devices for use with specific applications such as card readers or other devices.

As mentioned above, I/O controller 1040 can interact with audio subsystem 1020 or display subsystem 1030 or both. For example, input through a microphone or other audio device can provide input or commands for one or more applications or functions of system 1000. Additionally, audio output can be provided instead of or in addition to display output. In another example, if display subsystem includes a touchscreen, the display device also acts as an input device, which can be at least partially managed by I/O controller 1040. There can also be additional buttons or switches on system 1000 to provide I/O functions managed by I/O controller 1040.

In one example, I/O controller 1040 manages devices such as accelerometers, cameras, light sensors or other environmental sensors, gyroscopes, global positioning system (GPS), or other hardware that can be included in system 1000, or sensors 1012. The input can be part of direct user interaction, as well as providing environmental input to the system to influence its operations (such as filtering for noise, adjusting displays for brightness detection, applying a flash for a camera, or other features).

In one example, system 1000 includes power management 1050 that manages battery power usage, charging of the battery, and features related to power saving operation. Power management 1050 manages power from power source 1052, which provides power to the components of system 1000. In one example, power source 1052 includes an AC to DC (alternating current to direct current) adapter to plug into a wall outlet. Such AC power can be renewable energy (e.g., solar power, motion based power). In one example, power source 1052 includes only DC power, which can be provided by a DC power source, such as an external AC to DC converter. In one example, power source 1052 includes wireless charging hardware to charge via proximity to a charging field. In one example, power source 1052 can include an internal battery or fuel cell source.

Memory subsystem 1060 includes memory device(s) 1062 for storing information in system 1000. Memory subsystem 1060 can include nonvolatile (state does not change if power to the memory device is interrupted) or volatile (state is indeterminate if power to the memory device is interrupted) memory devices, or a combination. Memory 1060 can store application data, user data, music, photos, documents, or other data, as well as system data (whether long-term or temporary) related to the execution of the applications and functions of system 1000. In one example, memory subsystem 1060 includes memory controller 1064 (which could also be considered part of the control of system 1000, and could potentially be considered part of processor 1010). Memory controller 1064 includes a scheduler to generate and issue commands to control access to memory device 1062.

Connectivity 1070 includes hardware devices (e.g., wireless or wired connectors and communication hardware, or a combination of wired and wireless hardware) and software components (e.g., drivers, protocol stacks) to enable system 1000 to communicate with external devices. The external device could be separate devices, such as other computing devices, wireless access points or base stations, as well as peripherals such as headsets, printers, or other devices. In one example, system 1000 exchanges data with an external device for storage in memory or for display on a display device. The exchanged data can include data to be stored in memory, or data already stored in memory, to read, write, or edit data.

Connectivity 1070 can include multiple different types of connectivity. To generalize, system 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that system 1000 could both be a peripheral device ("to" 1082) to other computing devices, as well as have peripheral devices ("from" 1084) connected to it. System 1000 commonly has a "docking" connector to connect to other computing devices for purposes such as managing (e.g., downloading, uploading, changing, synchronizing) content on system 1000. Additionally, a docking connector can allow system 1000 to connect to certain peripherals that allow system 1000 to control content output, for example, to audiovisual or other systems.

In addition to a proprietary docking connector or other proprietary connection hardware, system 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

Figure 11:
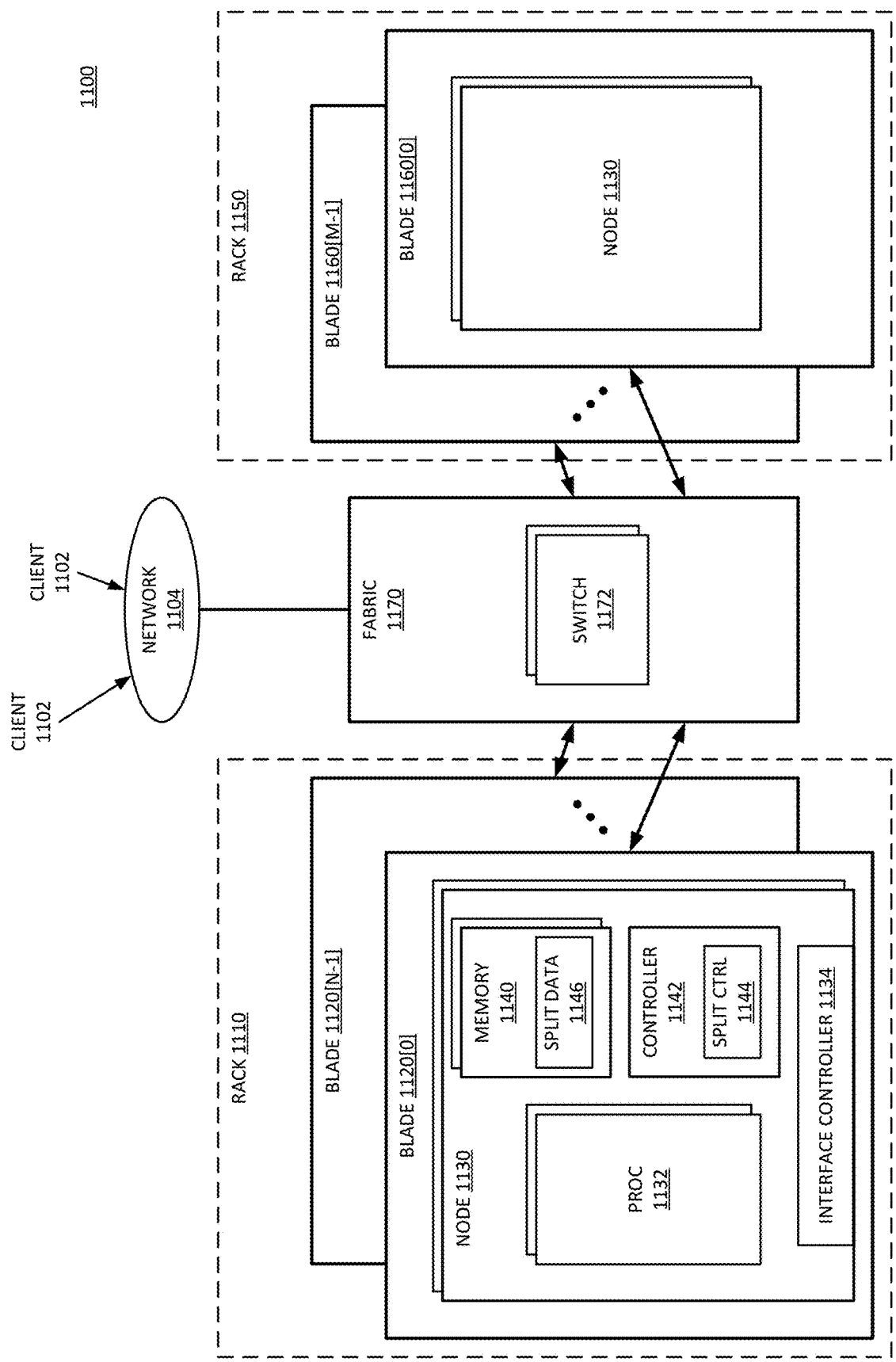
FIG. 11 is a block diagram of an example of a multi-node network in which split line memory access can be implemented.

FIG. 11 is a block diagram of an example of a multi-node network in which split line memory access can be implemented. System 1100 represents a network of nodes that can apply adaptive ECC. In one example, system 1100 represents a data center. In one example, system 1100 represents a server farm. In one example, system 1100 represents a data cloud or a processing cloud.

Nodes 1130 of system 1100 represent a system in accordance with an example of system 100 or system 300. Node 1130 includes memory 1140. Node 1130 includes controller 1142, which represents a memory controller to manage access to memory 1140. In one example, controller 1142 includes split control (CTRL) 1144, to control the access to memory 1140 as parallel resources with split line access in accordance with any example herein. The split control enables the providing of data to multiple resources, which frees up data capacity that can be used as metadata instead of ECC data, in accordance with any example herein. In one example, memory 1140 includes split data 1146 to represent split data in accordance with any example herein.

One or more clients 1102 make requests over network 1104 to system 1100. Network 1104 represents one or more local networks, or wide area networks, or a combination. Clients 1102 can be human or machine clients, which generate requests for the execution of operations by system 1100. System 1100 executes applications or data computation tasks requested by clients 1102.

In one example, system 1100 includes one or more racks, which represent structural and interconnect resources to house and interconnect multiple computation nodes. In one example, rack 1110 includes multiple nodes 1130. In one example, rack 1110 hosts multiple blade components 1120. Hosting refers to providing power, structural or mechanical support, and interconnection. Blades 1120 can refer to computing resources on printed circuit boards (PCBs), where a PCB houses the hardware components for one or more nodes 1130. In one example, blades 1120 do not include a chassis or housing or other "box" other than that provided by rack 1110. In one example, blades 1120 include housing with exposed connector to connect into rack 1110. In one example, system 1100 does not include rack 1110, and each blade 1120 includes a chassis or housing that can stack or otherwise reside in close proximity to other blades and allow interconnection of nodes 1130.

System 1100 includes fabric 1170, which represents one or more interconnectors for nodes 1130. In one example, fabric 1170 includes multiple switches 1172 or routers or other hardware to route signals among nodes 1130. Additionally, fabric 1170 can couple system 1100 to network 1104 for access by clients 1102. In addition to routing equipment, fabric 1170 can be considered to include the cables or ports or other hardware equipment to couple nodes 1130 together. In one example, fabric 1170 has one or more associated protocols to manage the routing of signals through system 1100. In one example, the protocol or protocols is at least partly dependent on the hardware equipment used in system 1100.

As illustrated, rack 1110 includes N blades 1120. In one example, in addition to rack 1110, system 1100 includes rack 1150. As illustrated, rack 1150 includes M blades 1160. M is not necessarily the same as N; thus, it will be understood that various different hardware equipment components could be used, and coupled together into system 1100 over fabric 1170. Blades 1160 can be the same or similar to blades 1120. Nodes 1130 can be any type of node and are not necessarily all the same type of node. System 1100 is not limited to being homogenous, nor is it limited to not being homogenous.

For simplicity, only the node in blade 1120[0] is illustrated in detail. However, other nodes in system 1100 can be the same or similar. At least some nodes 1130 are computation nodes, with processor (proc) 1132 and memory 1140. A computation node refers to a node with processing resources (e.g., one or more processors) that executes an operating system and can receive and process one or more tasks. In one example, at least some nodes 1130 are server nodes with a server as processing resources represented by processor 1132 and memory 1140. A storage server refers to a node with more storage resources than a computation node, and rather than having processors for the execution of tasks, a storage server includes processing resources to manage access to the storage nodes within the storage server.

In one example, node 1130 includes interface controller 1134, which represents logic to control access by node 1130 to fabric 1170. The logic can include hardware resources to interconnect to the physical interconnection hardware. The logic can include software or firmware logic to manage the interconnection. In one example, interface controller 1134 is or includes a host fabric interface, which can be a fabric interface in accordance with any example described herein.

Processor 1132 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory 1140 can be or include memory devices and a memory controller.

In general with respect to the descriptions herein, in one example a memory controller includes: a hardware input/output (I/O) interface to couple to multiple memory resources, including a first memory resource and a second memory resource; and control logic to distribute a portion of data from the first memory resource as a first one-half portion in the first memory resource and a second one-half portion in the second memory resource, the portion of data including N error checking and correction (ECC) bits to provide error correction on the portion of the data, wherein the first one-half portion and the second one-half portion each including (N−M)/2 ECC bits to provide error correction on the one-half portions; wherein the control logic is to distribute M non-ECC bits between the first one-half portion and the second one-half portion.

In one example of the memory controller, the portion of data comprises a wordline. In accordance with any preceding example of the memory controller, in one example, the control logic is to perform access of the first one-half portion with burst chop of data of the first memory resource, and to perform access of the second one-half portion with burst chop of data of the second memory resource. In accordance with any preceding example of the memory controller, in one example, the first memory resource comprises a first rank and the second memory resource comprises a second rank. In accordance with any preceding example of the memory controller, in one example, the first memory resource comprises a first dual inline memory module (DIMM) and the second memory resource comprises a second DIMM. In accordance with any preceding example of the memory controller, in one example, the multiple memory resources comprise 10×4 dynamic random access memory (DRAM) devices. In accordance with any preceding example of the memory controller, in one example, N equals 2*M. In accordance with any preceding example of the memory controller, in one example, N equals 64 ECC bits to provide error correction for 512 data bits, and wherein M equals 32 data bits to provide error correction for 256 data bits. In accordance with any preceding example of the memory controller, in one example, the M non-ECC bits comprise metadata bits. In accordance with any preceding example of the memory controller, in one example, the M metadata bits comprise two level memory (2LM) bits, Trusted Domain Extension (TDX) bits, or in-memory directory bits. In accordance with any preceding example of the memory controller, in one example, the N ECC bits are to provide single device data correction (SDDC) for the portion of data, and wherein the (N−M)/2 ECC bits are to provide SDDC for a one-half portion of data. In accordance with any preceding example of the memory controller, in one example, the memory resources comprise synchronous dynamic random access memory (SDRAM) devices in accordance with a double data rate version 5 (DDR5) standard.

In general with respect to the descriptions herein, in one example a method includes: splitting a line of data into two half lines of data, a first half line and a second half line, wherein the line of data includes N error checking and correction (ECC) bits to provide error correction on the line of data; computing first (N−M)/2 error checking and correction (ECC) bits for the first half line and second (N−M)/2 ECC bits for the second half line; generating first M/2 metadata bits for the first half line and second M/2 metadata bits for the second half line; and storing the first half line with the first (N−M)/2 ECC bits and the M/2 metadata bits in a first memory resource, and storing the second half line with the second (N−M)/2 ECC bits and the second M/2 metadata bits in a second memory resource separate from the first memory resource.

In one example of the method, the line of data comprises a wordline. In accordance with any preceding example of the method, in one example, storing the first half line in the first memory resource and the second half line in the second memory resource comprises performing a data write with burst chop. In accordance with any preceding example of the method, in one example, the first memory resource comprises a first rank and the second memory resource comprises a second rank. In accordance with any preceding example of the method, in one example, the first memory resource comprises a first dual inline memory module (DIMM) and the second memory resource comprises a second DIMM. In accordance with any preceding example of the method, in one example, the first memory resource and the second memory resource comprise 10×4 dynamic random access memory (DRAM) devices. In accordance with any preceding example of the method, in one example, N equals 2*M. In accordance with any preceding example of the method, in one example, N equals 64 ECC bits to provide error correction for 512 data bits, and wherein M equals 32 data bits to provide error correction for 256 data bits. In accordance with any preceding example of the method, in one example, the M metadata bits comprise two level memory (2LM) bits, Trusted Domain Extension (TDX) bits, or in-memory directory bits. In accordance with any preceding example of the method, in one example, the N ECC bits are to provide single device data correction (SDDC) for the portion of data, and wherein the (N−M)/2 ECC bits are to provide SDDC for a half line of data.

In general with respect to the descriptions herein, in one example a system includes: a memory including a first memory resource and a second memory resource; and a memory controller coupled to the memory, the memory controller including control logic to distribute a portion of data from the first memory resource as a first one-half portion in the first memory resource and a second one-half portion in the second memory resource, the portion of data including N error checking and correction (ECC) bits to provide error correction on the portion of the data, wherein the first one-half portion and the second one-half portion each including (N−M)/2 ECC bits to provide error correction on the one-half portions; wherein the control logic is to distribute M non-ECC bits between the first one-half portion and the second one-half portion.

In one example of the system, the portion of data comprises a wordline. In accordance with any preceding example of the system, in one example, the control logic is to perform access of the first one-half portion with burst chop of data of the first memory resource, and to perform access of the second one-half portion with burst chop of data of the second memory resource. In accordance with any preceding example of the system, in one example, the first memory resource comprises a first rank and the second memory resource comprises a second rank. In accordance with any preceding example of the system, in one example, the first memory resource comprises a first dual inline memory module (DIMM) and the second memory resource comprises a second DIMM. In accordance with any preceding example of the system, in one example, the multiple memory resources comprise 10×4 dynamic random access memory (DRAM) devices. In accordance with any preceding example of the system, in one example, N equals 2*M. In accordance with any preceding example of the system, in one example, N equals 64 ECC bits to provide error correction for 512 data bits, and wherein M equals 32 data bits to provide error correction for 256 data bits. In accordance with any preceding example of the system, in one example, the M metadata bits comprise two level memory (2LM) bits, Trusted Domain Extension (TDX) bits, or in-memory directory bits. In accordance with any preceding example of the system, in one example, the N ECC bits are to provide single device data correction (SDDC) for the portion of data, and wherein the (N−M)/2 ECC bits are to provide SDDC for a one-half portion of data. In accordance with any preceding example of the system, in one example, the memory resources comprise synchronous dynamic random access memory (SDRAM) devices in accordance with a double data rate version 5 (DDR5) standard.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory controller comprising:
a hardware input/output (I/O) interface to couple to multiple memory resources, including a first memory resource and a second memory resource; and
control logic to distribute a portion of data from the first memory resource as a first one-half portion in the first memory resource and a second one-half portion in the second memory resource, the portion of data including N error checking and correction (ECC) bits to provide error correction on the portion of the data, wherein the first one-half portion and the second one-half portion each including (N−M)/2 ECC bits to provide error correction on the respective one-half portions;
wherein the control logic is to distribute M non-ECC bits between the first one-half portion and the second one-half portion.

2. The memory controller of claim 1, wherein the portion of data comprises a wordline.

3. The memory controller of claim 1, wherein the control logic is to perform access of the first one-half portion with burst chop of data of the first memory resource, and to perform access of the second one-half portion with burst chop of data of the second memory resource.

4. The memory controller of claim 1, wherein the first memory resource comprises a first rank and the second memory resource comprises a second rank.

5. The memory controller of claim 1, wherein the first memory resource comprises a first dual inline memory module (DIMM) and the second memory resource comprises a second DIMM.

6. The memory controller of claim 1, wherein the multiple memory resources comprise 10×4 dynamic random access memory (DRAM) devices.

7. The memory controller of claim 1, wherein N equals 2*M.

8. The memory controller of claim 7, wherein N equals 64 ECC bits to provide error correction for 512 data bits, and wherein M equals 32 non-ECC bits, to provide 32 ECC bits for error correction for 256 data bits and 32 bits for system data.

9. The memory controller of claim 1, wherein the M non-ECC bits comprise metadata bits.

10. The memory controller of claim 1, wherein the N ECC bits are to provide single device data correction (SDDC) for the portion of data, and wherein the (N−M)/2 ECC bits are to provide SDDC for a one-half portion of data.

11. The memory controller of claim 1, wherein the memory resources comprise synchronous dynamic random access memory (SDRAM) devices in accordance with a double data rate version 5 (DDR5) standard.

12. A method for memory access comprising:
splitting a line of data into two half lines of data, a first half line and a second half line, wherein the line of data includes N error checking and correction (ECC) bits to provide error correction on the line of data;
computing first (N−M)/2 error checking and correction (ECC) bits for the first half line and second (N−M)/2 ECC bits for the second half line;
generating first M/2 metadata bits for the first half line and second M/2 metadata bits for the second half line; and
storing the first half line with the first (N−M)/2 ECC bits and the M/2 metadata bits in a first memory resource, and storing the second half line with the second (N−M)/2 ECC bits and the second M/2 metadata bits in a second memory resource separate from the first memory resource.

13. The method of claim 12, wherein the line of data comprises a wordline.

14. The method of claim 12, wherein storing the first half line in the first memory resource and the second half line in the second memory resource comprises performing a data write with burst chop.

15. The method of claim 12, wherein the first memory resource comprises a first rank and the second memory resource comprises a second rank.

16. The method of claim 12, wherein the first memory resource comprises a first dual inline memory module (DIMM) and the second memory resource comprises a second DIMM.

17. The method of claim 12, wherein the first memory resource and the second memory resource comprise 10×4 dynamic random access memory (DRAM) devices.

18. The method of claim 12, wherein N equals 2*M, and wherein N equals 64 ECC bits to provide error correction for 512 data bits, and wherein M equals 32 non-ECC bits, to provide 32 ECC bits for error correction for 256 data bits and 32 bits for system data.

19. The method of claim 12, wherein the M metadata bits comprise two level memory (2LM) bits, Trusted Domain Extension (TDX) bits, or in-memory directory bits.

20. The method of claim 12, wherein the N ECC bits are to provide single device data correction (SDDC) for the line of data, and wherein the (N−M)/2 ECC bits are to provide SDDC for a half line of data.

* * * * *